United States Patent
Estakhri et al.

(10) Patent No.: US 7,424,593 B2
(45) Date of Patent: **\*Sep. 9, 2008**

(54) INCREASING THE MEMORY PERFORMANCE OF FLASH MEMORY DEVICES BY WRITING SECTORS SIMULTANEOUSLY TO MULTIPLE FLASH MEMORY DEVICES

(75) Inventors: Petro Estakhri, Pleasanton, CA (US); Berhanu Iman, Sunyvale, CA (US)

(73) Assignee: Micron Technology, Inc., Boise, ID (US)

( * ) Notice: Subject to any disclaimer, the term of this patent is extended or adjusted under 35 U.S.C. 154(b) by 12 days.

This patent is subject to a terminal disclaimer.

(21) Appl. No.: 11/404,577

(22) Filed: Apr. 13, 2006

(65) Prior Publication Data

US 2006/0195651 A1 Aug. 31, 2006

Related U.S. Application Data

(63) Continuation of application No. 10/832,421, filed on Apr. 26, 2004, now Pat. No. 7,111,140, which is a continuation of application No. 10/152,969, filed on May 20, 2002, now Pat. No. 6,728,851, which is a continuation of application No. 10/071,972, filed on Feb. 5, 2002, now Pat. No. 6,757,800, which is a continuation of application No. 09/705,474, filed on Nov. 2, 2000, now Pat. No. 6,397,314, which is a continuation of application No. 09/487,865, filed on Jan. 20, 2000, now Pat. No. 6,202,138, which is a continuation of application No. 09/030,697, filed on Feb. 25, 1998, now Pat. No. 6,081,878, which is a continuation-in-part of application No. 08/946,331, filed on Oct. 7, 1997, now Pat. No. 5,930,815, which is a continuation-in-part of application No. 08/831,266, filed on Mar. 31, 1997, now Pat. No. 5,907,856, which is a continuation-in-part of application No. 08/509,706, filed on Jul. 31, 1995, now Pat. No. 5,845,313.

(51) Int. Cl.
*G06F 12/04* (2006.01)
(52) U.S. Cl. .................. 711/209; 711/103; 711/157
(58) Field of Classification Search ............. 711/168, 711/103, 150, 202, 5; 365/189.04, 230.03, 365/210, 185.11
See application file for complete search history.

(56) References Cited

U.S. PATENT DOCUMENTS

| | | | |
|---|---|---|---|
| 4,099,069 A | 7/1978 | Cricchi et al. |
| 4,130,900 A | 12/1978 | Watanabe |
| 4,210,959 A | 7/1980 | Wozniak |
| 4,309,627 A | 1/1982 | Tabata |
| 4,355,376 A | 10/1982 | Gould |
| 4,398,248 A | 8/1983 | Hsia et al. |
| 4,405,952 A | 9/1983 | Slakmon |
| 4,414,627 A | 11/1983 | Nakamura |
| 4,450,559 A | 5/1984 | Bond et al. |
| 4,456,971 A | 6/1984 | Fukuda et al. |
| 4,468,730 A | 8/1984 | Dodd et al. |
| 4,473,878 A | 9/1984 | Zolnowsky et al. |
| 4,476,526 A | 10/1984 | Dodd |
| 4,498,146 A | 2/1985 | Martinez |
| 4,525,839 A | 6/1985 | Nozawa et al. |
| 4,532,590 A | 7/1985 | Wallach et al. |
| 4,609,833 A | 9/1986 | Gutterman |
| 4,616,311 A | 10/1986 | Sato |
| 4,654,847 A | 3/1987 | Dutton |
| 4,710,871 A | 12/1987 | Belknap et al. |
| 4,746,998 A | 5/1988 | Robinson et al. |
| 4,748,320 A | 5/1988 | Yorimoto et al. |
| 4,757,474 A | 7/1988 | Fukushi et al. |
| 4,774,700 A | 9/1988 | Satoh et al. |
| 4,780,855 A | 10/1988 | Iida et al. |
| 4,788,665 A | 11/1988 | Fukuda et al. |
| 4,797,543 A | 1/1989 | Watanabe |
| 4,800,520 A | 1/1989 | Iijima |
| 4,829,169 A | 5/1989 | Watanabe |
| 4,843,224 A | 6/1989 | Ohta et al. |
| 4,896,262 A | 1/1990 | Wayama et al. |
| 4,914,529 A | 4/1990 | Bonke |
| 4,920,518 A | 4/1990 | Nakamura et al. |
| 4,924,331 A | 5/1990 | Robinson et al. |

| | | | | | |
|---|---|---|---|---|---|
| 4,943,745 A | 7/1990 | Watanabe et al. | 5,541,551 A | 7/1996 | Brehner et al. |
| 4,953,122 A | 8/1990 | Williams | 5,544,118 A | 8/1996 | Harari |
| 4,970,642 A | 11/1990 | Yamamura | 5,544,356 A | 8/1996 | Robinson |
| 4,970,727 A | 11/1990 | Miyawaki et al. | 5,552,698 A | 9/1996 | Tai et al. |
| 5,070,474 A | 12/1991 | Tuma et al. | 5,554,553 A | 9/1996 | Harari |
| 5,093,785 A | 3/1992 | Iijima | 5,563,825 A | 10/1996 | Cernea et al. |
| 5,168,465 A | 12/1992 | Harari | 5,566,314 A | 10/1996 | DeMarco et al. |
| 5,198,380 A | 3/1993 | Harari | 5,568,439 A | 10/1996 | Harari |
| 5,200,959 A | 4/1993 | Gross et al. | 5,572,466 A | 11/1996 | Sukegawa |
| 5,218,695 A | 6/1993 | Noveck et al. | 5,579,502 A | 11/1996 | Konishi et al. |
| 5,220,518 A | 6/1993 | Haq | 5,581,723 A | 12/1996 | Hasbun et al. |
| 5,226,168 A | 7/1993 | Kobayashi et al. | 5,583,812 A | 12/1996 | Harari |
| 5,227,714 A | 7/1993 | Lou | 5,592,415 A | 1/1997 | Kato et al. |
| 5,253,351 A | 10/1993 | Yamamoto et al. | 5,592,420 A | 1/1997 | Cernea et al. |
| 5,267,218 A | 11/1993 | Elbert | 5,596,526 A | 1/1997 | Assar et al. |
| 5,268,318 A | 12/1993 | Harari | 5,598,370 A | 1/1997 | Niisima et al. |
| 5,268,870 A | 12/1993 | Harari | 5,602,987 A | 2/1997 | Harari et al. |
| 5,270,979 A | 12/1993 | Harari et al. | 5,603,001 A | 2/1997 | Sukegawa et al. |
| 5,293,560 A | 3/1994 | Harari | 5,606,660 A | 2/1997 | Estakhri et al. |
| 5,303,198 A | 4/1994 | Adachi et al. | 5,611,067 A | 3/1997 | Okamoto et al. |
| 5,305,276 A | 4/1994 | Uenoyama | 5,640,528 A | 6/1997 | Harney et al. |
| 5,305,278 A | 4/1994 | Inoue | 5,642,312 A | 6/1997 | Harari |
| 5,315,541 A | 5/1994 | Harari et al. | 5,648,929 A | 7/1997 | Miyamoto |
| 5,315,558 A | 5/1994 | Hag | 5,663,901 A | 9/1997 | Wallace et al. |
| 5,329,491 A | 7/1994 | Brown et al. | 5,693,570 A | 12/1997 | Cernea et al. |
| 5,337,275 A | 8/1994 | Garner | 5,712,819 A | 1/1998 | Harari |
| 5,341,330 A | 8/1994 | Wells et al. | 5,719,808 A | 2/1998 | Harari et al. |
| 5,341,339 A | 8/1994 | Wells | 5,723,990 A | 3/1998 | Roohparvar |
| 5,341,341 A | 8/1994 | Fukazo | 5,734,567 A | 3/1998 | Griffiths et al. |
| 5,353,256 A | 10/1994 | Fandrich et al. | 5,745,418 A | 4/1998 | Ma et al. |
| 5,357,475 A | 10/1994 | Hasbun et al. | 5,754,567 A | 5/1998 | Norman |
| 5,359,569 A | 10/1994 | Fujita et al. | 5,757,712 A | 5/1998 | Nagel et al. |
| 5,365,127 A | 11/1994 | Manley | 5,758,100 A | 5/1998 | Odisho |
| 5,369,615 A | 11/1994 | Harari et al. | 5,761,117 A | 6/1998 | Uchino et al. |
| 5,371,702 A | 12/1994 | Nakai et al. | 5,768,190 A | 6/1998 | Tanaka et al. |
| 5,381,539 A | 1/1995 | Yanai et al. | 5,768,195 A | 6/1998 | Nakamura et al. |
| 5,382,839 A | 1/1995 | Shinohara | 5,773,901 A | 6/1998 | Kanter |
| 5,384,743 A | 1/1995 | Rouy | 5,778,418 A | 7/1998 | Auclair et al. |
| 5,388,083 A | 2/1995 | Assar et al. | 5,781,478 A | 7/1998 | Takeeuchi et al. |
| 5,396,468 A | 3/1995 | Harari et al. | 5,787,445 A | 7/1998 | Daberko |
| 5,404,485 A | 4/1995 | Ban | 5,787,484 A | 7/1998 | Norman |
| 5,406,527 A | 4/1995 | Honma | RE35,881 E | 8/1998 | Barrett et al. |
| 5,418,752 A | 5/1995 | Harari et al. | 5,799,168 A | 8/1998 | Ban |
| 5,422,842 A | 6/1995 | Cernea et al. | 5,802,551 A | 9/1998 | Komatsu et al. |
| 5,422,856 A | 6/1995 | Sasaki et al. | 5,809,515 A | 9/1998 | Kaki et al. |
| 5,428,621 A | 6/1995 | Mehrotha et al. | 5,809,558 A | 9/1998 | Matthews et al. |
| 5,430,682 A | 7/1995 | Ishikawa et al. | 5,809,560 A | 9/1998 | Schneider |
| 5,430,859 A | 7/1995 | Norman et al. | 5,818,350 A | 10/1998 | Estakhri et al. |
| 5,431,330 A | 7/1995 | Wieres | 5,818,781 A | 10/1998 | Estakhri et al. |
| 5,434,825 A | 7/1995 | Harari | 5,822,245 A | 10/1998 | Gupta et al. |
| 5,438,573 A | 8/1995 | Mangan et al. | 5,822,252 A | 10/1998 | Lee et al. |
| 5,465,235 A | 11/1995 | Miyamoto | 5,822,781 A | 10/1998 | Wells et al. |
| 5,465,338 A | 11/1995 | Clay | 5,831,929 A | 11/1998 | Manning |
| 5,471,478 A | 11/1995 | Mangan et al. | 5,835,935 A | 11/1998 | Estakhri et al. |
| 5,473,765 A | 12/1995 | Gibbons et al. | 5,838,614 A | 11/1998 | Estakhri et al. |
| 5,479,638 A | 12/1995 | Assar et al. | 5,845,313 A | 12/1998 | Estakhri et al. |
| 5,485,595 A | 1/1996 | Assar et al. | 5,847,552 A | 12/1998 | Brown |
| 5,490,117 A | 2/1996 | Oda et al. | 5,860,083 A | 1/1999 | Sukegawa |
| 5,495,442 A | 2/1996 | Cernea et al. | 5,860,124 A | 1/1999 | Matthews et al. |
| 5,504,760 A | 4/1996 | Harari et al. | 5,862,099 A | 1/1999 | Gannage et al. |
| 5,508,971 A | 4/1996 | Cernea et al. | 5,890,192 A | 3/1999 | Lee et al. |
| 5,513,138 A | 4/1996 | Manabe et al. | 5,901,086 A | 5/1999 | Wang et al. |
| 5,515,333 A | 5/1996 | Fujita et al. | 5,907,856 A | 5/1999 | Estakhri et al. |
| 5,519,847 A | 5/1996 | Fandrich et al. | 5,909,586 A | 6/1999 | Anderson |
| 5,523,980 A | 6/1996 | Sakui et al. | 5,920,884 A | 7/1999 | Jennings, III et al. |
| 5,524,230 A | 6/1996 | Sakaue et al. | 5,924,113 A | 7/1999 | Estakhri et al. |
| 5,530,673 A | 6/1996 | Tobita et al. | 5,928,370 A | 7/1999 | Asnaashari |
| 5,530,828 A | 6/1996 | Kaki et al. | 5,930,815 A | 7/1999 | Estakhri et al. |
| 5,530,938 A | 6/1996 | Akasaka et al. | 5,933,368 A | 8/1999 | Ma et al. |
| 5,532,962 A | 7/1996 | Auclair et al. | 5,933,846 A | 8/1999 | Endo |
| 5,532,964 A | 7/1996 | Cernea et al. | 5,936,971 A | 8/1999 | Harari et al. |
| 5,534,456 A | 7/1996 | Yuan et al. | 5,937,425 A | 8/1999 | Ban |
| 5,535,328 A | 7/1996 | Harari et al. | 5,953,737 A | 9/1999 | Estakhri et al. |

| | | | |
|---|---|---|---|
| 5,956,473 A | 9/1999 | Ma et al. | |
| 5,959,926 A | 9/1999 | Jones et al. | |
| 5,966,727 A | 10/1999 | Nishino et al. | |
| 5,986,933 A | 11/1999 | Takeuchi et al. | |
| 5,987,563 A | 11/1999 | Itoh et al. | |
| 5,987,573 A | 11/1999 | Hiraka | |
| 5,991,849 A | 11/1999 | Yamada et al. | |
| 6,011,322 A | 1/2000 | Hiraka | |
| 6,011,323 A | 1/2000 | Camp | |
| 6,018,265 A | 1/2000 | Keshtbod | |
| 6,021,408 A | 2/2000 | Ledain et al. | |
| 6,026,020 A | 2/2000 | Matsubara et al. | |
| 6,026,027 A | 2/2000 | Terrell, II et al. | |
| 6,034,897 A | 3/2000 | Estakhri et al. | |
| 6,035,357 A | 3/2000 | Sakaki | |
| 6,040,997 A | 3/2000 | Estakhri | |
| 6,047,352 A | 4/2000 | Lakhani et al. | |
| 6,055,184 A | 4/2000 | Acharya et al. | |
| 6,055,188 A | 4/2000 | Takeuchi et al. | |
| 6,069,827 A | 5/2000 | Sinclair | |
| 6,072,796 A | 6/2000 | Christensen et al. | |
| 6,076,137 A | 6/2000 | Asnaashari | |
| 6,081,447 A | 6/2000 | Lofgren et al. | |
| 6,081,878 A | 6/2000 | Estakhri et al. | |
| 6,084,483 A | 7/2000 | Keshtbod | |
| 6,097,666 A | 8/2000 | Sakui et al. | |
| 6,115,785 A | 9/2000 | Estakhri et al. | |
| 6,122,195 A | 9/2000 | Estakhri et al. | |
| 6,125,424 A | 9/2000 | Komatsu et al. | |
| 6,125,435 A | 9/2000 | Estakhri et al. | |
| 6,128,695 A | 10/2000 | Estakhri et al. | |
| 6,134,145 A | 10/2000 | Wong | |
| 6,134,151 A | 10/2000 | Estakhri et al. | |
| 6,141,249 A | 10/2000 | Estakhri et al. | |
| 6,145,051 A | 11/2000 | Estakhri et al. | |
| 6,151,247 A | 11/2000 | Estakhri et al. | |
| 6,172,906 B1 | 1/2001 | Estakhri et al. | |
| 6,173,362 B1 | 1/2001 | Yoda | |
| 6,181,118 B1 | 1/2001 | Meehan et al. | |
| 6,182,162 B1 | 1/2001 | Estakhri et al. | |
| 6,202,138 B1 | 3/2001 | Estakhri et al. | |
| 6,223,308 B1 | 4/2001 | Estakhri et al. | |
| 6,226,708 B1 | 5/2001 | McGoldrick et al. | |
| 6,230,234 B1 | 5/2001 | Estakhri et al. | |
| 6,262,918 B1 | 7/2001 | Estakhri et al. | |
| 6,272,610 B1 | 8/2001 | Katayama et al. | |
| 6,275,436 B1 | 8/2001 | Tobita et al. | |
| 6,279,069 B1 | 8/2001 | Robinson et al. | |
| 6,279,114 B1 | 8/2001 | Toombs et al. | |
| 6,285,607 B1 | 9/2001 | Sinclair | |
| 6,327,639 B1 | 12/2001 | Asnaashari | |
| 6,345,367 B1 | 2/2002 | Sinclair | |
| 6,374,337 B1 | 4/2002 | Estakhri | |
| 6,393,513 B2 | 5/2002 | Estakhri et al. | |
| 6,397,314 B1 | 5/2002 | Estakhri et al. | |
| 6,411,546 B1 | 6/2002 | Estakhri et al. | |
| 6,467,021 B1 | 10/2002 | Sinclair | |
| 6,490,649 B2 | 12/2002 | Sinclair | |
| 6,567,307 B1 | 5/2003 | Estakhri | |
| 6,578,127 B1 | 6/2003 | Sinclair | |
| 6,587,382 B1 | 7/2003 | Estakhri et al. | |
| 6,711,059 B2 | 3/2004 | Sinclair et al. | |
| 6,725,321 B1 | 4/2004 | Sinclair et al. | |
| 6,728,851 B1 | 4/2004 | Estakhri et al. | |
| 6,751,155 B2 | 6/2004 | Gorobets | |
| 6,757,800 B1 | 6/2004 | Estakhri et al. | |
| 6,813,678 B1 | 11/2004 | Sinclair et al. | |
| 6,898,662 B2 | 5/2005 | Gorobets | |
| 6,912,618 B2 | 6/2005 | Estakhri et al. | |
| 6,950,918 B1 | 9/2005 | Estakhri | |
| 6,957,295 B1 | 10/2005 | Estakhri | |
| 6,973,519 B2 | 12/2005 | Estakhri et al. | |
| 6,978,342 B1 | 12/2005 | Estakhri et al. | |
| 7,000,064 B2 | 2/2006 | Payne et al. | |
| 2003/0033471 A1 | 2/2003 | Lin et al. | |

FOREIGN PATENT DOCUMENTS

| | | |
|---|---|---|
| AU | 0 557 723 | 1/1987 |
| EP | 0 220 718 A2 | 5/1987 |
| EP | 0 243 503 A1 | 11/1987 |
| EP | 0 392 895 A2 | 10/1990 |
| EP | 0 424 191 A2 | 4/1991 |
| EP | 0 489 204 A1 | 6/1992 |
| EP | 0 522 780 A2 | 1/1993 |
| EP | 0 522 780 B1 | 1/1993 |
| EP | 0 544 252 A2 | 6/1993 |
| EP | 0 613 151 A2 | 8/1994 |
| EP | 0 617 363 A2 | 9/1994 |
| EP | 0 619 541 A2 | 10/1994 |
| EP | 0 663 636 A1 | 7/1995 |
| EP | 0 686 976 A2 | 12/1995 |
| EP | 0 852 766 B1 | 7/1998 |
| EP | 0 897 579 B1 | 7/2000 |
| EP | 0 891 580 B1 | 11/2000 |
| EP | 0 896 669 B1 | 11/2000 |
| EP | 0 852 765 B1 | 9/2001 |
| EP | 0 722 585 B1 | 5/2002 |
| EP | 0 910 826 B1 | 6/2002 |
| EP | 0 691 008 B1 | 11/2002 |
| EP | 0 861 468 B1 | 4/2003 |
| EP | 0 978 040 B1 | 5/2004 |
| EP | 1 157 328 B1 | 5/2005 |
| FR | 93 01908 | 8/1993 |
| GB | 2 251 323 A | 7/1992 |
| GB | 2 291 990 A | 2/1996 |
| GB | 2 291 991 A | 7/1996 |
| GB | 2 297 637 A | 7/1996 |
| GB | 2 304 428 A | 3/1997 |
| GB | 2 348 991 B | 12/2002 |
| GB | 2 351 822 B | 1/2003 |
| GB | 2 384 337 A | 7/2003 |
| GB | 2 384 883 A | 10/2005 |
| GB | 2 384 338 B | 11/2005 |
| GB | 2 384 072 B | 12/2005 |
| GB | 2 411 499 B | 2/2006 |
| IS | 117881 | 5/2003 |
| JP | 59-45695 A | 9/1982 |
| JP | 58-215794 A | 12/1983 |
| JP | 58-215795 A | 12/1983 |
| JP | 59-162695 A | 9/1984 |
| JP | 60-212900 | 10/1985 |
| JP | 61-96598 A | 5/1986 |
| JP | 62-283496 A | 12/1987 |
| JP | 62-283497 A | 12/1987 |
| JP | 63-183700 A | 7/1988 |
| JP | 1-138694 A | 5/1989 |
| JP | 3-228377 A | 10/1991 |
| JP | 4-57295 A | 2/1992 |
| JP | 4-254994 A | 9/1992 |
| JP | 4-268284 A | 9/1992 |
| JP | 4-278297 A | 10/1992 |
| JP | 4-332999 A | 11/1992 |
| JP | 5-128877 A | 5/1993 |
| JP | 5-282883 A | 10/1993 |
| JP | 6-36578 A | 2/1994 |
| JP | 6-124175 A | 5/1994 |
| JP | 6-124231 A | 5/1994 |
| JP | 6-131889 A | 5/1994 |
| JP | 6-132747 A | 5/1994 |
| JP | 6-149395 A | 5/1994 |
| JP | 6-266596 A | 9/1994 |
| JP | 7-93499 A | 4/1995 |
| JP | 7-311708 A | 11/1995 |
| JP | 8-18018 A | 1/1996 |
| JP | 8-69696 A | 3/1996 |

| | | |
|---|---|---|
| JP | 9-147581 A | 6/1997 |
| SU | 1388877 A1 | 4/1988 |
| SU | 1408439 A1 | 7/1988 |
| SU | 1515164 A1 | 10/1989 |
| SU | 1541619 A1 | 2/1990 |
| SU | 1573458 A2 | 6/1990 |
| SU | 1686449 A2 | 10/1991 |
| WO | WO 84/00628 | 2/1984 |
| WO | WO 94/20906 A1 | 9/1994 |

OTHER PUBLICATIONS

Mendel Rosenblum and John K. Ousterhout, The Design and Implementation of a Log-Structured File System, article, 1991, 15 pgs., Berkeley, USA.
Brian Dipert and Markus Levy, Designing with Flash Memory, book, Apr. 1994, 445 pgs., Annabooks, San Diego, USA.
Science Forum, Inc., Flash Memory Symposium '95, symposium, 1995, 13 pgs.; Hongo, Bunkyo-ku, Tokyo.
Ross S. Finlayson and David R. Cheriton, An Extended File Service Exploiting Write-Once Storage, article, 1987, 10 pgs. ACM.
Jason Gait, The Optical File Cabinet: A Random-Access File System for Write-Once Optical Disks, article. Jun. 1988, 12 pgs., Beaverton, Oregon.
Henry G. Baker, Memory Management, book, 1995, 19 pgs., Springer-Verlag Bertin Heidelberg, Germany.
Sape J. Mullender and Andrew S. Tanenbaum, A Distributed File Service Based on Optimistic Concurrency Control, article, 1985, 12 pgs., ACM.
Hiroshi Nakamura, Junichi Miyamoto, Kenichi Imamiya and Yoshihisa Iwata, A Novel Sense Amplifier for Flexible Voltage Operation NAND Flash Memories, symposium, 1995, VLSI Circuits Digest of Technical Papers,, 2 pgs.
Hiroshi Nakamura, Junichi Miyamoto, Kenichi Imamiya, Yoshihisa Iwata, Yoshihisa Sugiura and Hideko Oodaira, A Novel Sensing Scheme with On-Chip Page Copy for Flexible Voltage NAND Flash Memories, article, Jun. 1996, 9 pgs. . . , vol. E79-C, No. 6.
Takaaki Nozaki, Toshiaki Tanaka, Yoshiro Kijiya, Eita Kinoshita, Tatsuo Tsuchiya and Yutaka Hayashi, A 1-Mb EEPROM with MONOS Memory Cell for Semiconductor Disk Application, article, 1991, 5 pgs., Journal of Solid -State Circuits, vol. 26, No. 4.
Kai Hwang and Faye A. Briggs, Computer Architecture and Parallel Processing, book, 1984, McGraw-Hill, Inc., 2 pgs., US.
Walter Lahti and Dean McCarron, State of the Art: Magnetic VS. Optical Store Data in Flash, article, 1990, 7 pgs., vol. 15, No. 12, McGraw-Hill, Inc., US.
Ron Wilson, Integrated Circuits; 1-Mbit flash memories seek their role in system design, article, Mar. 1, 1989, 2 pgs., No. 6, Tulsa, OK.
S. Mehroura, J.H. Yuan, R.A. Cemea, W.Y. Chien, D.C. Guteman, S. Samachisa, R.D. Noman, M. Mofidi, W.Lee, Y. Fong, A. Mihnea , E. Hann, R.W. Gregor, E.P. Eberhardt, J.R. Radosevich, K.R. Stiles, R.A. Kohler, C.W. Leung, and T.J. Mulrooney, Serial 9Mb F EEPROM for Solid State Disk Applications, symposium, 1992, 2 pgs., Mountain View, CA.
Steven H. Leibson, Nonvolatile, in-circuit-reprogrammable memories, article, Jan. 3, 1991, 12 pgs., EDN, Circle No. 12.
Walter Lahti and Dean McCarron, State of the Art: Magnetic VS. Optical Store Data in a Flash, article, 1990, 7 pgs., vol. 15, No. 12, McGraw-Hill, Inc., US.
Kai Hwang and Faye A. Briggs, Computer Architecture and Parallel Processing, book, 1984, McGraw-Hill, Inc., 2 pgs., US.
Steven H. Leibson, Nonvolatile, in-circuit-reprogrammable memories, article, Jan. 3, 1991, 12 pgs., EDN, Circle No. 12.
Ramon Caceres, Fred Douglis, Kai Li and Brian Marsh, Operationg System Implications of Solid-State Mobile Computers, article, 7 pgs., Oct. 1993, Workshop on Workstation Operting Systems.
Michael Wu and Wily Zwaenepoel, A Non-Volatile, Main Memory Storage System, 12 pgs., 1994, ACM, San Jose, CA USA.
Dave Bursky, Innovative flash memories match DRAM densities: available with a choice of features, flash memories are finding homes in many systems (includes related articles on the orgins of flash, and on the differences between NAND and NOR flash memories), article, May 16, 1994, 9 pgs., Electronic Design, v.42, n.10, The Gale Group.

Anthony Cataldo, New flash enhancements up ante. (Intel's 28F004BV-120 and 28F004BV-120, Atmel's AT29BV010 and AT29BV020, and Samsung Semiconductors's KM29V32000 flash memory devices)(Product Announcement), article, Mar. 13, 1995, 4 pgs., Electronic News, v.41, n.2056, The Gale Group.
Sam Weber, Flash modules' portability, reusability, small size valued for a host of APPs-Consumer formats flocking to flash, article, Jul. 22, 1996, 9 pgs., Electronic Engineering Times, n.911, CMP Media.
Toshiba, MOS Memory (Non-Volatile), 1995, Data Book.
Stan Baker, But Integration Calls for Hardware, Software Changes: Flash: designers face the dawn of a new memory age, article, Sep. 12, 2003, 5 pgs., Electronic Engineering Times, 1990, N.619, 41, CMP Media.
Toshiba, Toshiba MOS Digital Integrated Circuit Silicon Gate CMOS, (TC58NS512DC) Mar. 21, 2001, 43 pgs., Data Book.
Toshiba Corporation, SMIL (Smartmedia Interface Library) Hardware Edition Version 1.00, Jul. 1, 2000, 36 pgs., Data Book.
Toshiba, Toshiba MOS Digital Integrated Circuit Silicon Gate, (TC58512FT), Mar. 5, 2001, 43 pgs., Data Book.
Toshiba, Toshiba MOS Digital Integrated Circuit Silicon Gate, (TC58DVM92A1FT00), Jan. 10, 2003, 44 pgs., Data Book.
Toshiba, Toshiba MOS Digital Integrated Circuit Silicon Gate, (TC58DVG02A1FT00), Jan. 10, 2003, 44 pgs., Data Book.
Toshiba, Toshiba MOS Digital Integrated Circuit Silicon Gate, (TH58100FT), Mar. 5, 2001, 43 pgs., Data Book.
35Nonvolatile Memory Technology Review, A Time of Change, Proceedings 1993 Conference, Jun. 22-24, 1993, Linthlcum Heights, MD USA.
Toshiba Corporation, SMIL (Smartmedia Interface Library) Software Edition Version 1.00, Jul. 1, 2000, 136 pgs., Data Book.
Toshiba, MOS Memory (Non-Volatile), 1996, 279 pgs., Data Book.
Dan Auclair, Optimal Solid State Disk Architecure For Portable Computers, symposium, Jul. 9, 1991, 7 pgs., SunDisk Corporation.
Book- Computer Architecture and Parallel Processing, Kai Hwang & Faye A. Briggs, McGraw-Hill Book Co., Copyright 1984, p. 64.
Magazine-"State of the Art : Magnetic VS. Optical Store Data ina Flash", by Walter Lahti and Dean McCarron, Byte magazine dated Nov. 1, 1990.311, vol. 15, No. 12.
Magazine—Technology Updates, Integrated Cirrcuits, "1 -Mbit flash memories seek their role in system design", Ron Wilson, Senior Editor, Computer Design magazine 28 Mar. 1, 1989, No. 5, Tulsa OK, US, pp. 30 and 32.
1992 Symposium of VLSI Circuits Digest of Technical Papers, "EEPROM for Solid State Disk Applications", S. Mehoura et al., SunDisk Corporation, Santa Clara, CA. R.W. Gregor et al., AT&T Bell Laboratories, Allentown, PA, pp. 24 and 25.

*Primary Examiner*—Kevin Ellis
*Assistant Examiner*—Jesse Diller
(74) *Attorney, Agent, or Firm*—Leffert Jay & Polglaze, P.A.

(57) ABSTRACT

In one embodiment of the present invention, a memory storage system for storing information organized in sectors within a nonvolatile memory bank is disclosed. The memory bank is defined by sector storage locations spanning across one or more rows of a nonvolatile memory device, each the sector including a user data portion and an overhead portion. The sectors being organized into blocks with each sector identified by a host provided logical block address (LBA). Each block is identified by a modified LBA derived from the host-provided LBA and said virtual PBA, said host-provided LBA being received by the storage device from the host for identifying a sector of information to be accessed, the actual PBA developed by said storage device for identifying a free location within said memory bank wherein said accessed sector is to be stored. The storage system includes a memory controller coupled to the host; and a nonvolatile memory bank coupled to the memory controller via a memory bus, the memory bank being included in a non-volatile semiconductor memory unit, the memory bank has storage blocks each of which includes a first row-portion located in said memory unit, and a corresponding second row-portion located in each of the memory unit, each of the memory row-portions provides storage space for two of said sectors, wherein the speed of performing write operations is increased by writing sector information to the memory unit simultaneously.

40 Claims, 17 Drawing Sheets

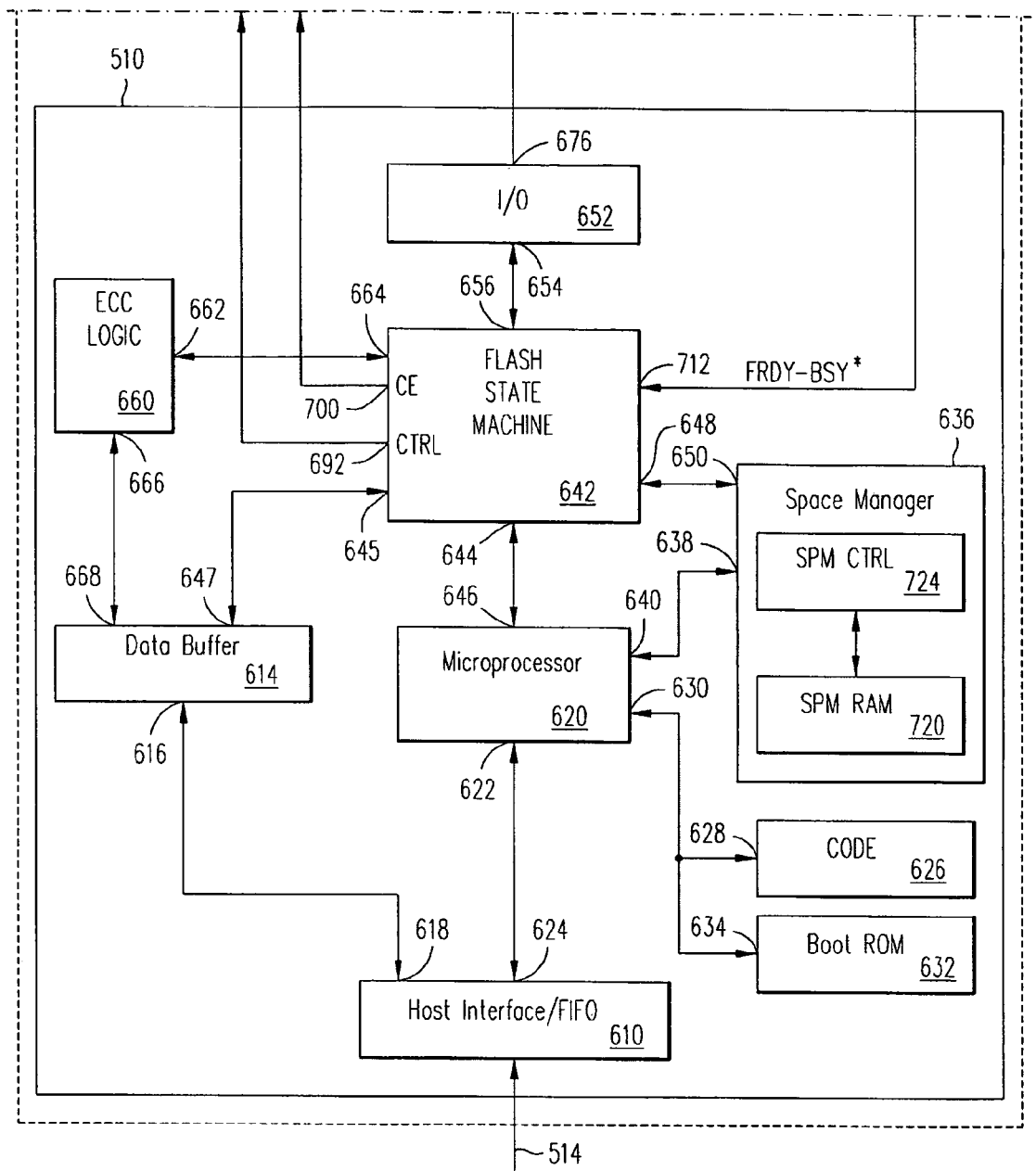

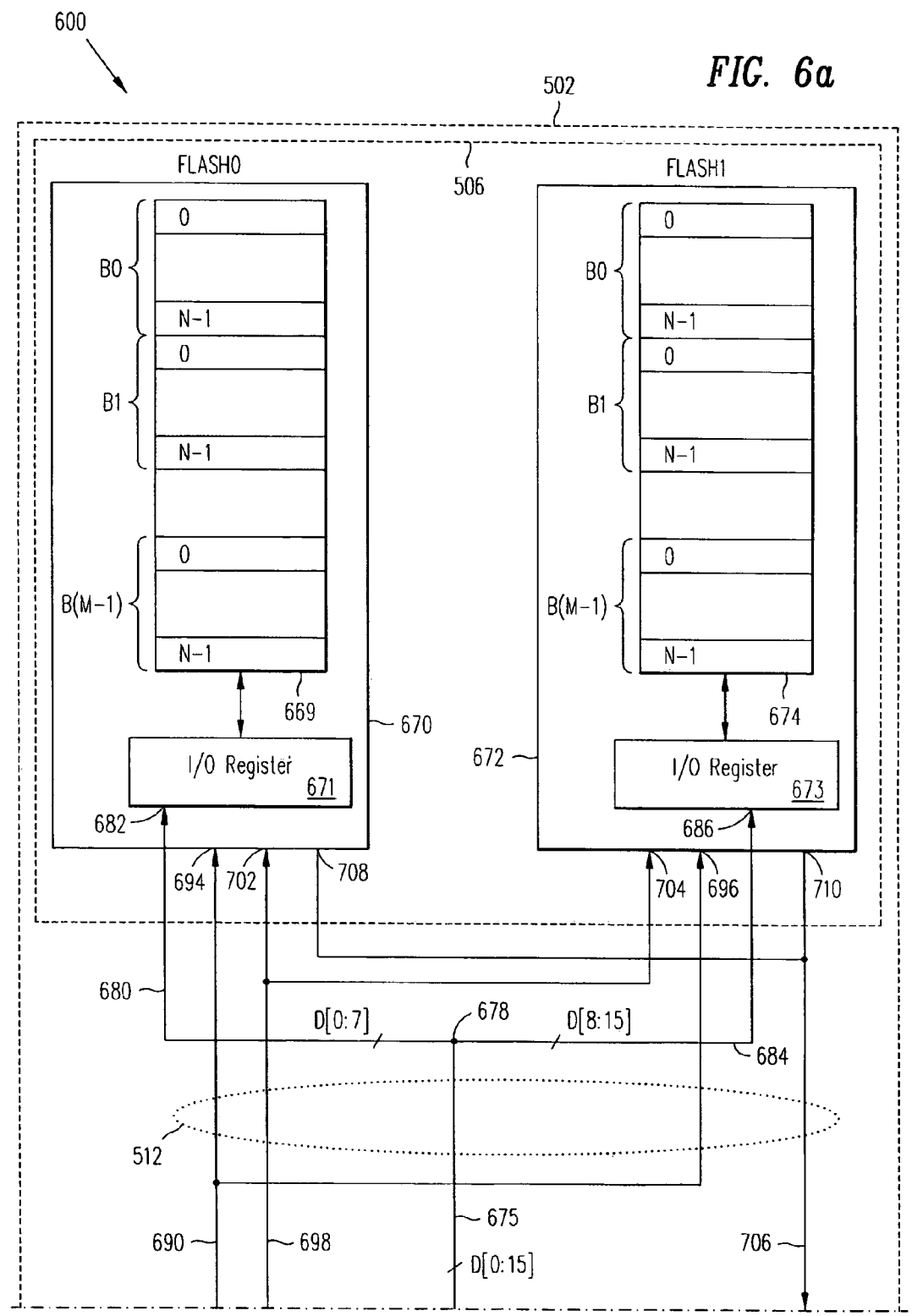

INCREASING THE MEMORY PERFORMANCE OF FLASH MEMORY DEVICES BY WRITING SECTORS SIMULTANEOUSLY TO MULTIPLE FLASH MEMORY DEVICES

CROSS REFERENCE TO RELATED APPLICATIONS

This application is a continuation of our U.S. patent application Ser. No. 10/832,421 filed on Apr. 26, 2004, now U.S. Pat. No. 7,111,140 entitled "Increasing the Memory Performance of Flash Memory Devices by Writing Sectors Simultaneously to Multiple Flash Memory Devices", which is a continuation of our prior application Ser. No. 10/152,969 filed May 20, 2002, now U.S. Pat. No. 6,728,851, issued on Apr. 27, 2004, entitled "Increasing the Memory Performance of Flash Memory Devices by Writing Sectors Simultaneously to Multiple Flash Memory Devices", which is continuation of our prior application Ser. No. 10/071,972 file Feb. 5, 2002, now U.S. Pat. No. 6,757,800, issued on Jun. 29, 2004, and entitled "Increasing the Memory Performance of Flash Memory Devices by Writing Sectors Simultaneously to Multiple Flash Memory Devices", which is a continuation of our prior application Ser. No. 09/705,474 filed Nov. 2, 2000, now U.S. Pat. No. 6,397,314, issued on May 28, 2002 and entitled "Increasing the Memory Performance of Flash Memory Devices by Writing Sectors Simultaneously to Multiple Flash Memory Devices", which is a continuation of our prior application Ser. No. 09/487,865 filed Jan. 20, 2000, now U.S. Pat. No. 6,202,138 issued on Mar. 13, 2001, entitled "Increasing the Memory Performance of Flash Memory Devices by Writing Sectors Simultaneously to Multiple Flash Memory Devices", which is a continuation of application Ser. No. 09/030,697 filed Feb. 25, 1998, now U.S. Pat. No. 6,081,878 issued on Jun. 27, 2000, entitled "Increasing the Memory Performance of Flash Memory Devices by Writing Sectors Simultaneously to Multiple Flash Memory Devices", which is a continuation-in-part of application Ser. No. 08/946,331 filed Oct. 7, 1997, now U.S. Pat. No. 5,930,815, issued on Jul. 27, 1999, entitled "Moving; Sequential Sectors Within a Block of Information In a Flash Memory Mass Storage Architecture", which is a continuation-in-part of application Ser. No. 08/831,266 filed Mar. 31, 1997, now U.S. Pat. No. 5,907,856 issued on May 25, 1999, entitled "Moving Sectors Within a Block of Information In a Flash Memory Mass Storage Architecture", which is a continuation-in-part application of application Ser. No. 08/509,706 filed Jul. 31, 1995, now U.S. Pat. No. 5,845,313, issued on Dec. 12, 1998, entitled "Direct Logical Block Addressing Flash Memory Mass Storage Architecture".

BACKGROUND OF THE INVENTION

1. Field of the Invention

This invention relates to the field of digital systems, such as personal computers and digital cameras, employing nonvolatile memory as mass storage, for use in replacing hard disk storage or conventional film. More particularly, this invention relates to an architecture for increasing the performance of such digital systems by increasing the rate at which digital information is read from and written to the nonvolatile memory.

2. Description of the Prior Art

With the advent of higher capacity solid state storage devices (nonvolatile memory), such as flash or EEPROM memory, many digital systems have replaced conventional mass storage devices with flash and/or EEPROM memory devices. For example, personal computers (PCs) use solid state storage devices for mass storage purposes in place of conventional hard disks. Digital cameras employ solid state storage devices in cards to replace conventional films.

FIG. 1 shows a prior art memory system 10 including a controller 12, which is generally a semiconductor (or integrated circuit) device, coupled to a host 14 which may be a PC or a digital camera. The controller 12 is further coupled to a nonvolatile memory bank 16. Host 14 writes and reads information, organized in sectors, to and from memory bank 16 which includes a first nonvolatile memory chip 18 and a second nonvolatile memory chip 20. Chip 18 includes: an I/O register 22 having a port 24 connected to a port 26 of controller 12 via a first bus 28 which includes 8 bit lines; and a storage area 30 coupled with I/O register 22. Chip 20 includes: an I/O register 32 having a port 34 connected to a port 36 of controller 12 via a second bus 38 which includes 8 bit lines; and a storage area 40 coupled with I/O register 32. The first and second buses 28, 38 are used to transmit data, address, and command signals between the controller and the memory chips 18 and 20. The least significant 8 bits (LSBs) of 16 bits of information are provided to chip 18 via the first bus 28, and the most significant 8 bits (MSBs) are provided to the chip 20 via the second bus 38.

Memory bank 16 includes a plurality of block locations 42 each of which includes a plurality of memory row locations. Each block location of the memory bank is comprised of a first sub-block 44 located in the first non-volatile memory chip, and a corresponding second sub-block 46 located in the second non-volatile memory chip. Each memory row location includes a first row-portion 48 and a corresponding second row-portion 50. In the depicted embodiment each of the first and second row-portions 48 and 50 includes storage for 256 bytes of data information plus an additional 8 bytes of storage space for overhead information. Where a sector includes 512 bytes of user data and 16 bytes of non-user data (the latter commonly referred to as overhead information), 256 bytes of the user data and 8 bytes of the overhead information of the sector may be maintained in the first row portion 48 of chip 18 and the remaining 256 bytes of user data and remaining 8 bytes of overhead information of the same sector may be maintained in the second row portion 50 of chip 20. Thus, half of a sector is stored in a memory row location 48 of chip 18 and the other half of the sector is stored in memory row location 50 of chip 20. Additionally, half of the overhead information of each stored sector is maintained by chip 18 and the other half by chip 20.

In general, reading and writing data to flash memory chips 18 and 20 is time consuming. Writing data to the flash memory chips is particularly time consuming because data must be latched in I/O registers 22 and 32, which are loaded 1 byte at a time via the first and second buses, and then transferred from the I/O registers 22 and 32 to the memory cells of the flash memory chips 18 and 20 respectively. The time required to transfer data from the I/O registers to memory, per byte of data, is proportional to the size of the I/O registers and the size of the flash memory chip.

During a write operation, controller 12 writes a single sector of information to memory bank 16 by: (1) transmitting a write command signal to each of chips 18 and 20 via buses 28 and 38 simultaneously; (2) transmitting address data to chips 18 and 20 specifying corresponding sub-blocks 44 and 46 of the chips via buses 28 and 38 simultaneously; and (3) sequentially transmitting a byte of user data to each of chips 18 and 20 via buses 28 and 38 simultaneously for storage in the corresponding sub-blocks 44 and 46. The problem with such prior art systems is that while two bytes of information are written and read at a time, only one sector of information is accommodated at a time by the memory bank 16 during a write command initiated by the host 14.

Another prior art digital system 60 is shown in FIG. 2 to include a controller 62 coupled to a host 64, and a nonvolatile memory bank 66 for storing and reading information organized in sectors to and from nonvolatile memory chip 68, included in the memory bank 66. While not shown, more chips may be, included in the memory bank, although the controller, upon command by the host, stores an entire sector in one chip. A block, such as block 0, includes 16 sectors S0, S1, ..., S15. Also included in the chip 68 is an I/O register 70, which includes 512 bytes plus 16 bytes, a total of 528 bytes, of storage space. The controller transfers information between host 64 and memory 66 a byte at-a-time. A sector of 512 bytes of user data plus 16 bytes of overhead information is temporarily stored in the I/O register during a write operation and then transferred to one of the blocks within the memory device for storage thereof. During a read operation, a sector of information is read from one of the blocks of the memory device and then stored in the I/O register for transfer to the controller. An important problem with the prior art architecture of FIG. 2 is that while a total of 528 bytes may be stored in the I/O register 36, only one byte of sector information may be transferred at a time between the controller and the memory bank thereby impeding the overall performance of the system.

Both of the prior art systems of FIGS. 1 and 2 maintain LBA to PBA mapping information for translating a host-provided logical block address (LBA) identifying a sector of information to a physical block address (PBA) identifying the location of a sector within the memory bank. This mapping information may generally be included in volatile memory, such as a RAM, within the controller, although it may be maintained outside of the controller.

FIG. 3 shows a table diagram illustrating an example of an LBA-PBA map 300 defined by rows and columns, with each row 302 being uniquely identified, addressed, by a value equal to that of the LBA received from the host divided by 16. The row numbers of FIG. 3 are shown using hexadecimal notation. Thus, for example, row 10H (in Hex.) has an address value equal to 16 in decimal. Each row 302 of map 300, includes a storage location field 304 for maintaining a virtual PBA value, an 'old' flag field 306, a 'used' flag field 308, and a 'defect' flag field 310. The flag fields provide information relating to the status of a block of information maintained within the memory bank (in FIGS. 1 and 2). The virtual PBA field 304 stores information regarding the location of the block within the memory bank.

FIG. 4 shows a table diagram illustrating an exemplary format for storage of a sector of data maintained in a memory bank. The virtual PBA field 304 (FIG. 3) provides information regarding the location of a block 400 of information with each block having a plurality of sectors 402. Each sector 402 is comprised of a user data field 404, an ECC field 406, an 'old' flag field 408, a 'used' flag field 410 and a 'defect' flag field 412.

A further problem associated with prior art systems of the kind discussed herein is that the table 300 (in FIG. 3) occupies much 'real estate' and since it is commonly comprised of RAM technology, which is in itself costly and generally kept within the controller, there is substantial costs associated with its manufacturing. Furthermore, as each row of table 300 is associated with one block of information, the larger the number of blocks of information, the larger the size of the table, which is yet an additional cost for manufacturing the controller and therefore the digital system employing such a table.

What is needed is a digital system employing nonvolatile memory for storage of digital information organized in sector format for reducing the time associated with performing reading and writing operations on the sectors of information thereby increasing the overall performance of the system while reducing the costs of manufacturing the digital system.

SUMMARY OF THE INVENTION

It is an object of the present invention to increase the performance of a digital system having a controller coupled to a host for operating a nonvolatile memory bank including one or more nonvolatile memory devices, such as flash and/or EEPROM chips, by reducing the time associated with reading and writing information to the nonvolatile memory bank.

It is another object of the present invention, as described herein, to decrease the time associated with storing sectors of information by writing at least two sectors of information to at least two nonvolatile memory semiconductor devices during a single write command initiated by the host.

It is another object of the present invention as described herein to decrease the time associated with reading sectors of information by reading at least two sectors of information from at least two nonvolatile memory semiconductor devices during a single read command initiated by the host.

It is a further object of the present invention to store overhead information associated with two sectors of information in one of the two nonvolatile memory semiconductor devices.

It is yet another object of the present invention to simultaneously access two bytes of a sector of information stored within two nonvolatile memory devices thereby increasing the rate of performance of a system employing the present invention by an order of magnitude of at least two.

It is yet another object of the present invention to access one byte of a first sector and one byte of a second sector of information simultaneously within two nonvolatile memory devices thereby increasing the rate of performance of a system employing the present invention.

It is a further object of the present invention to reduce the size of a volatile memory table, or map, that maintains translations between the host-provided sector addresses to addresses of blocks within the nonvolatile memory devices thereby reducing the cost of manufacturing the digital system.

Briefly, the present invention includes a digital system having a controller semiconductor device coupled to a host and a nonvolatile memory bank including a plurality of nonvolatile memory devices. The controller transfers information, organized in sectors, with each sector including a user data portion and an overhead portion, between the host and the nonvolatile memory bank and stores and reads two bytes of information relating to the same sector simultaneously within two nonvolatile memory devices. Each nonvolatile memory device is defined by a row of memory locations wherein corresponding rows of at least two semiconductor devices maintain two sectors of information therein with the overhead information relating to the two sectors maintained in one of the memory rows of the nonvolatile memory device. Each 32 sectors of information defines a block identified by a virtual physical block address with a block of information expanding between two memory devices wherein an even and an odd byte of a sector is simultaneously read from or written to two nonvolatile memory devices. In another embodiment, the controller stores an entire sector of information within a single nonvolatile memory device and reads from or writes to, a sector of information by processing corresponding bytes of at least two sectors in two nonvolatile memory devices simultaneously.

These and other objects and advantages of the present invention will no doubt become apparent to those skilled in the art after having read the following detailed description of the preferred embodiments illustrated in the several figures of the drawing.

IN THE DRAWINGS

FIG. 6 is a detailed block diagram of the memory system of FIG. 5.

Figure 7:
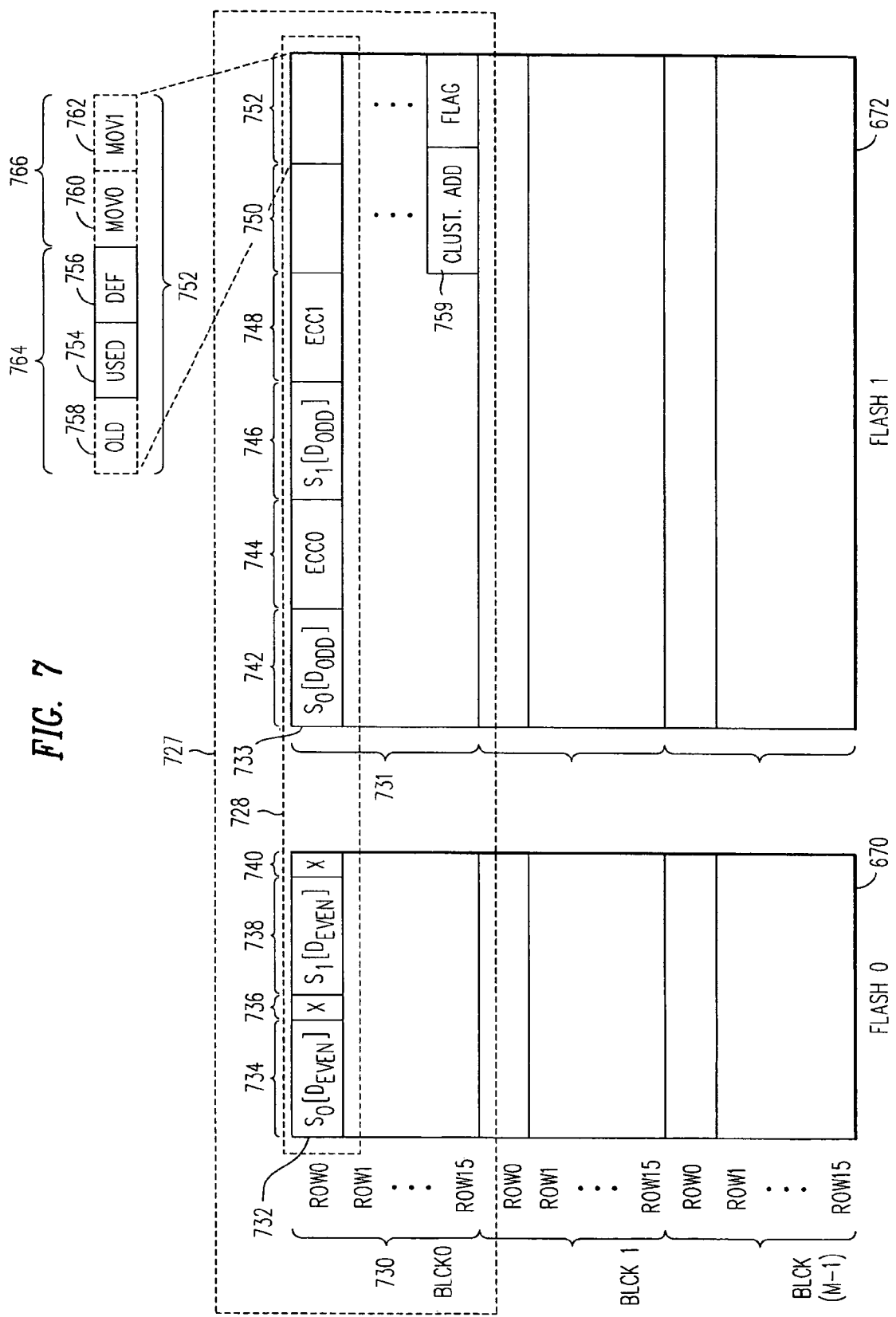

FIG. 7 is a table diagram generally illustrating a memory storage format for storing a block, including 32 sectors, of information in a memory bank including two non-volatile memory units wherein an even sector and an odd sector are stored in a single memory row location and wherein even data bytes of both sectors are stored in a row portion located in a first of the memory units and odd data bytes of both sectors are stored in a second row portion located in the second of the memory units.

Figure 8A:
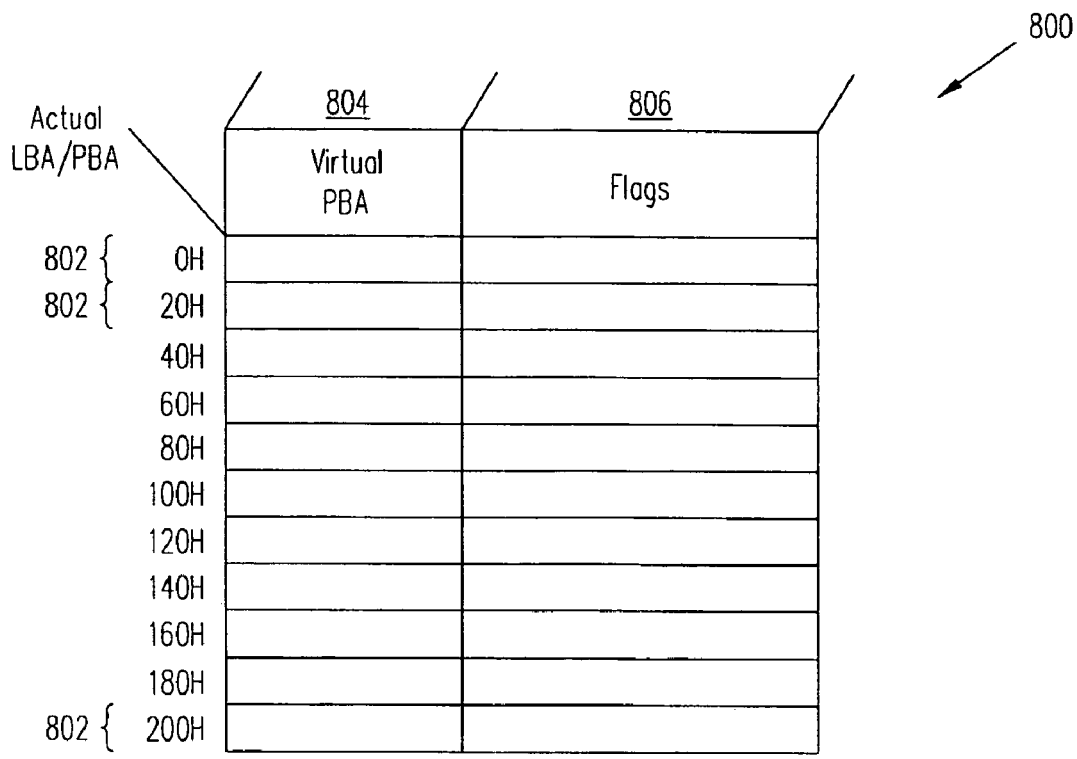

FIG. 8A is a table diagram generally illustrating organization of an exemplary LBA-PBA map for use in accordance with the present invention.

Figure 8B:
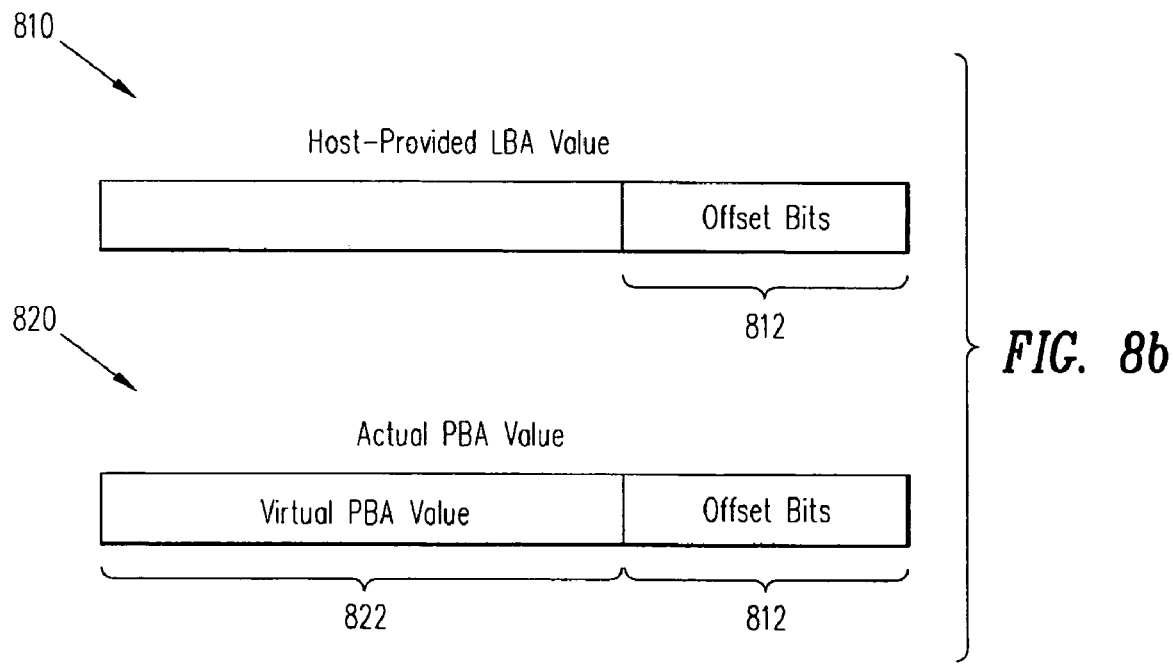

FIG. 8B shows a block diagram illustrating formats of address information identifying sectors and associated blocks of information in accordance with the present invention.

Figure 9:
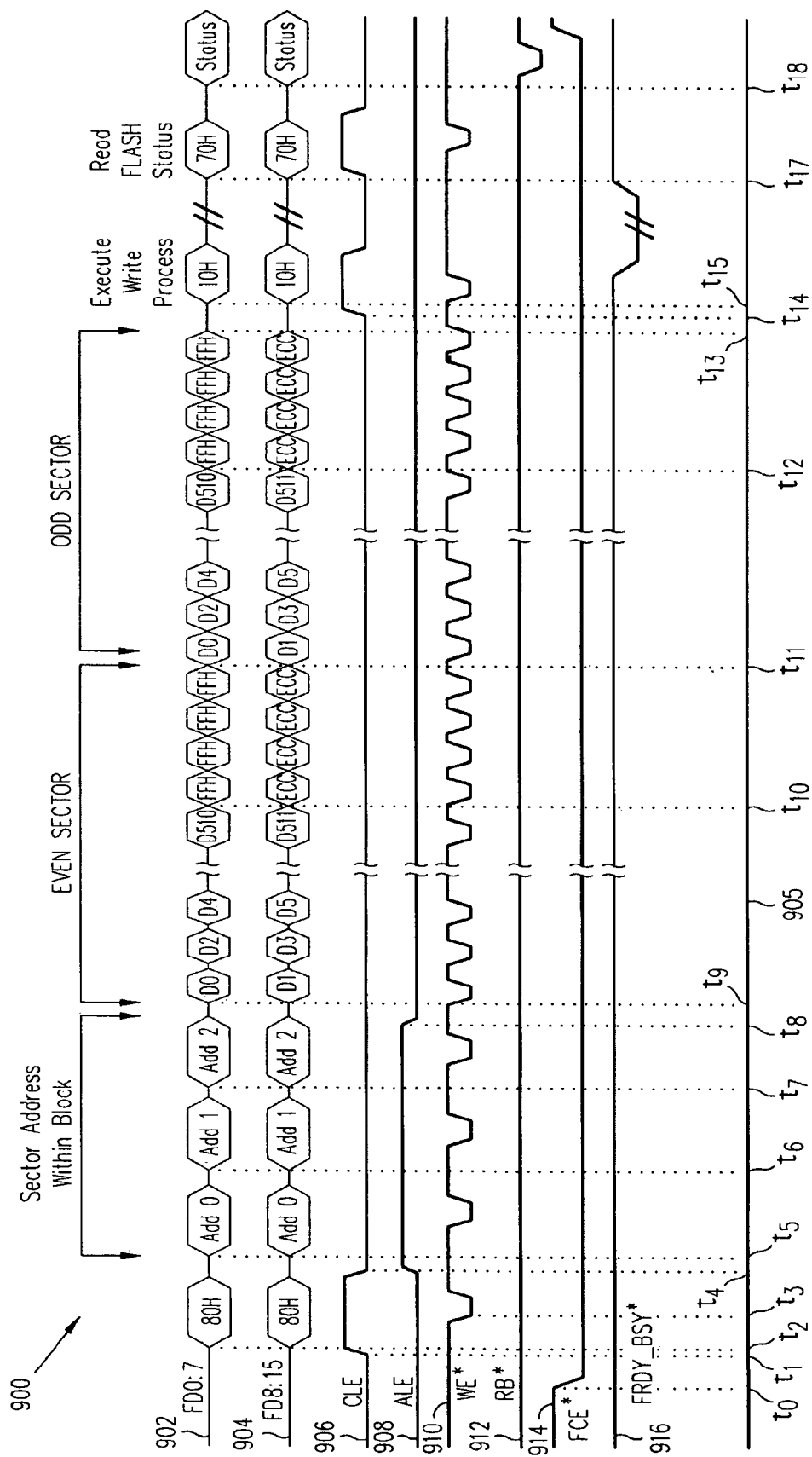

FIG. 9 is a timing diagram illustrating the timing of control, address, and data signals for a write operation performed by the memory system of FIG. 6 wherein two sectors of information are simultaneously written, during a single write operation, to a memory bank having the memory storage format illustrated in FIG. 7.

Figure 10:
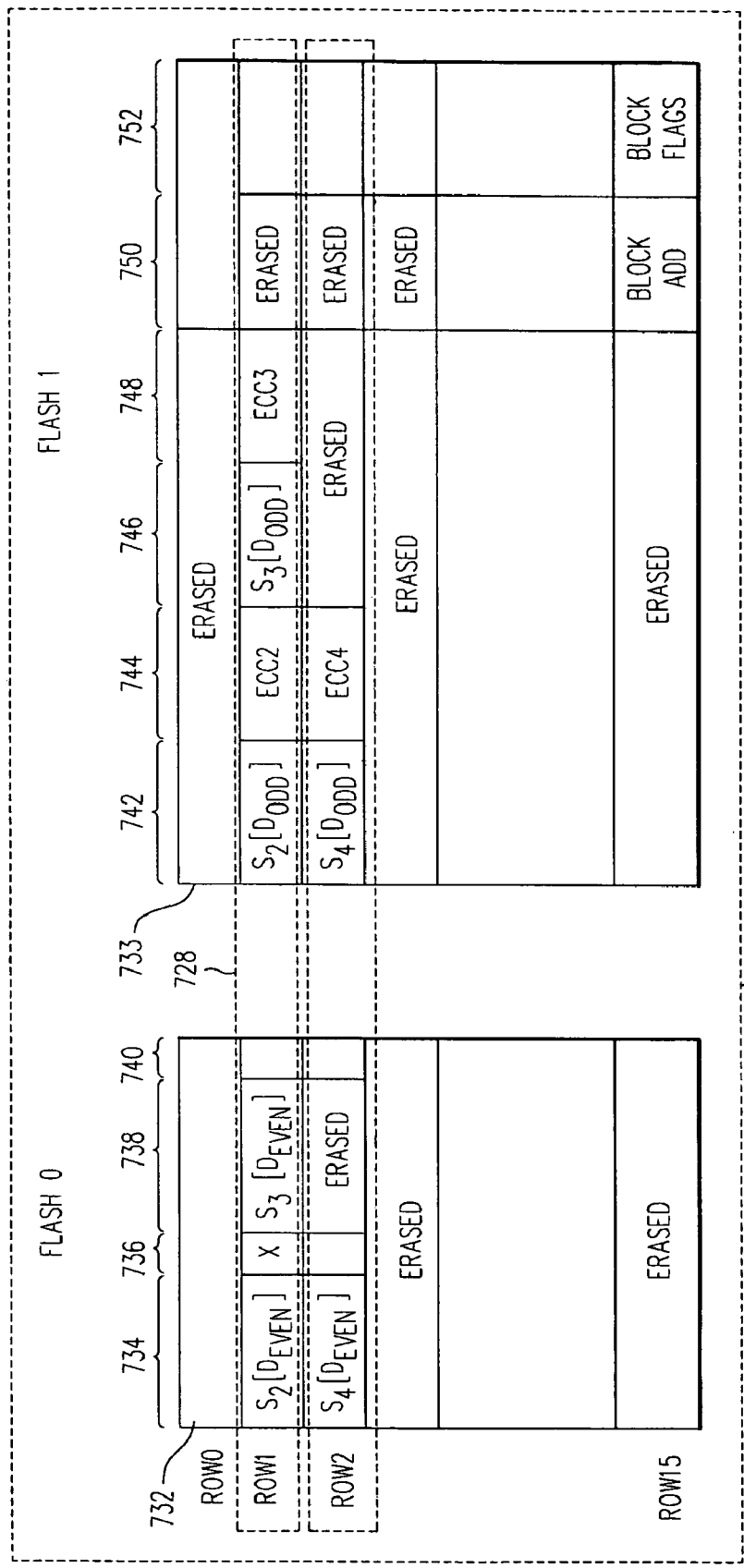

FIG. 10 is a table diagram illustrating a memory bank having a memory storage format as depicted in FIG. 7 wherein a single sector is written to a particular memory row location of the memory bank.

Figure 11:
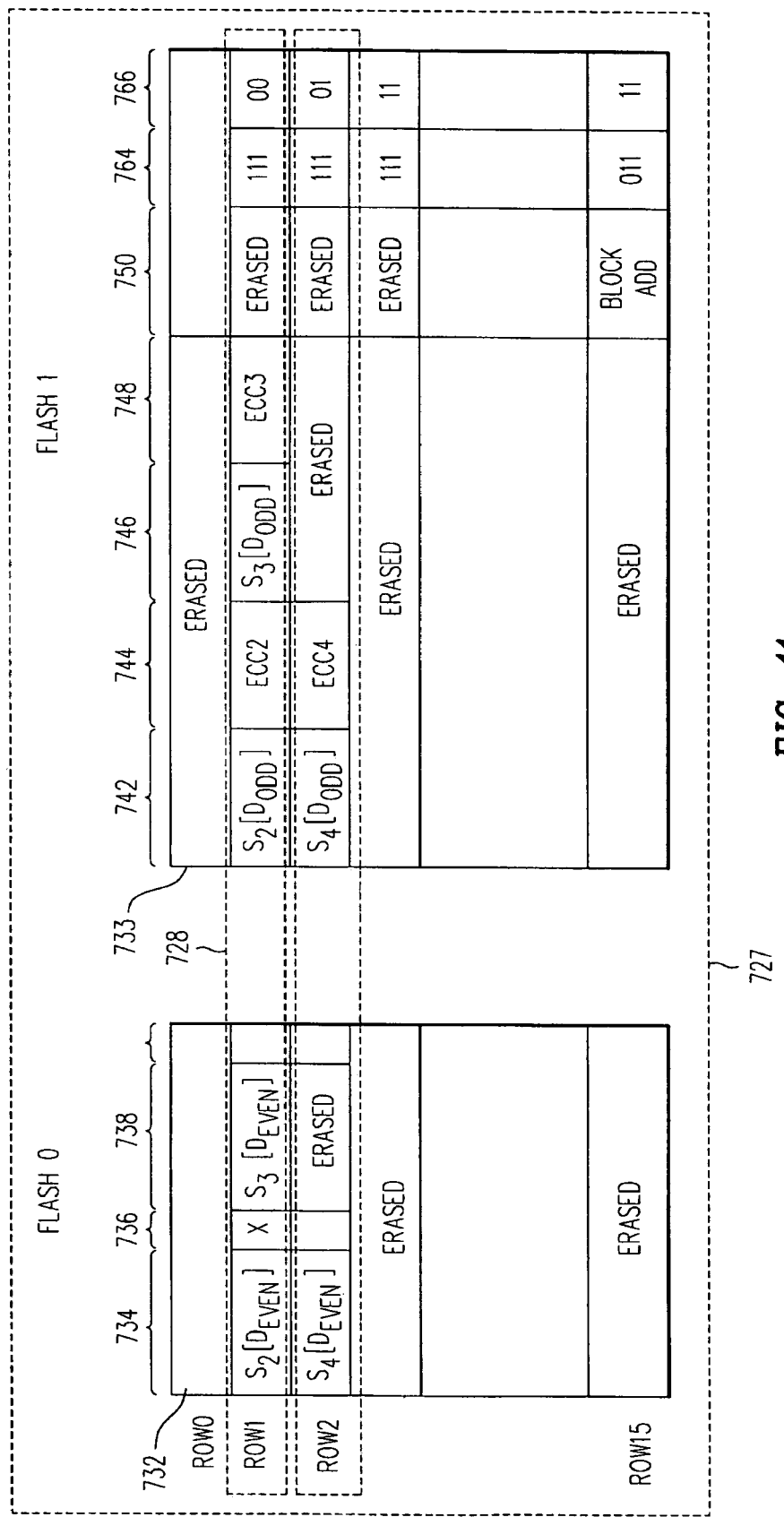

FIG. 11 is a table diagram illustrating a memory bank having an alternative memory storage format as depicted in FIG. 7 wherein a single sector is written to a particular memory row location of the memory bank.

Figures 1, 12:
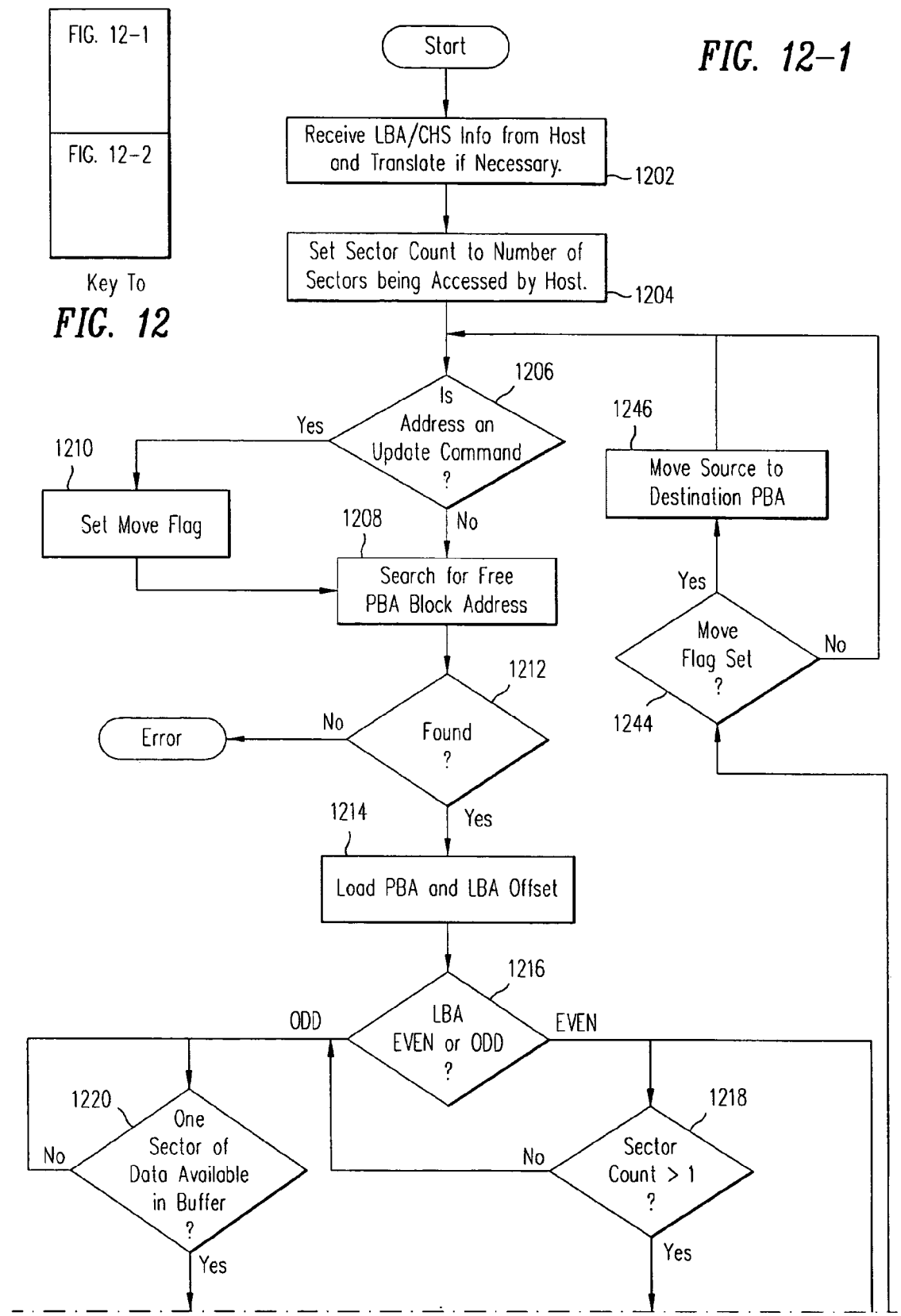
Figures 2, 12:
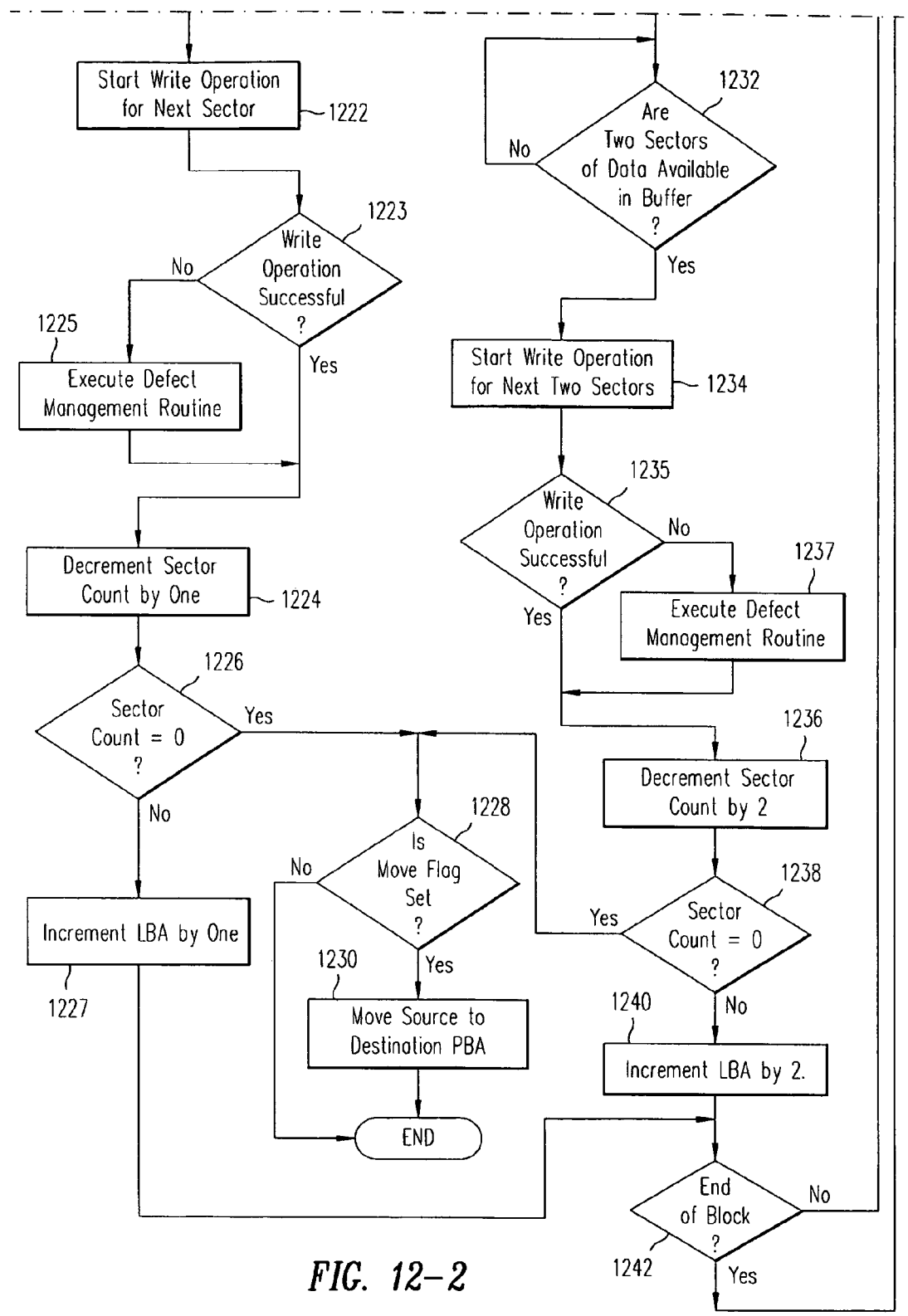

FIG. 12 is a flowchart illustrating a process of simultaneously writing two sectors of information to two memory units during a single write operation in accordance with the present invention.

Figure 12A:
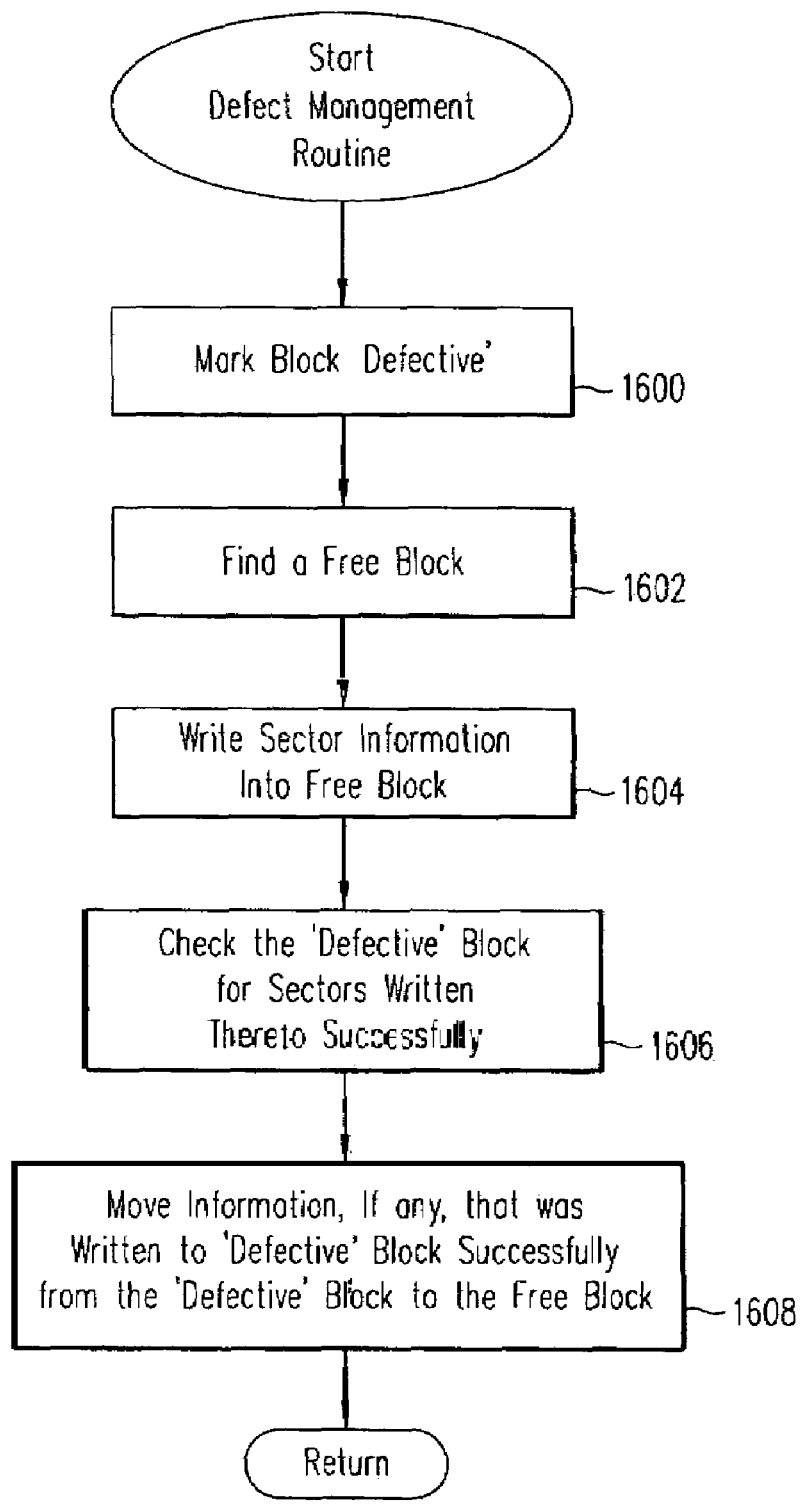

FIG. 12a shows a flow chart of the steps performed in executing the defect management routine of FIG. 12.

Figure 13:
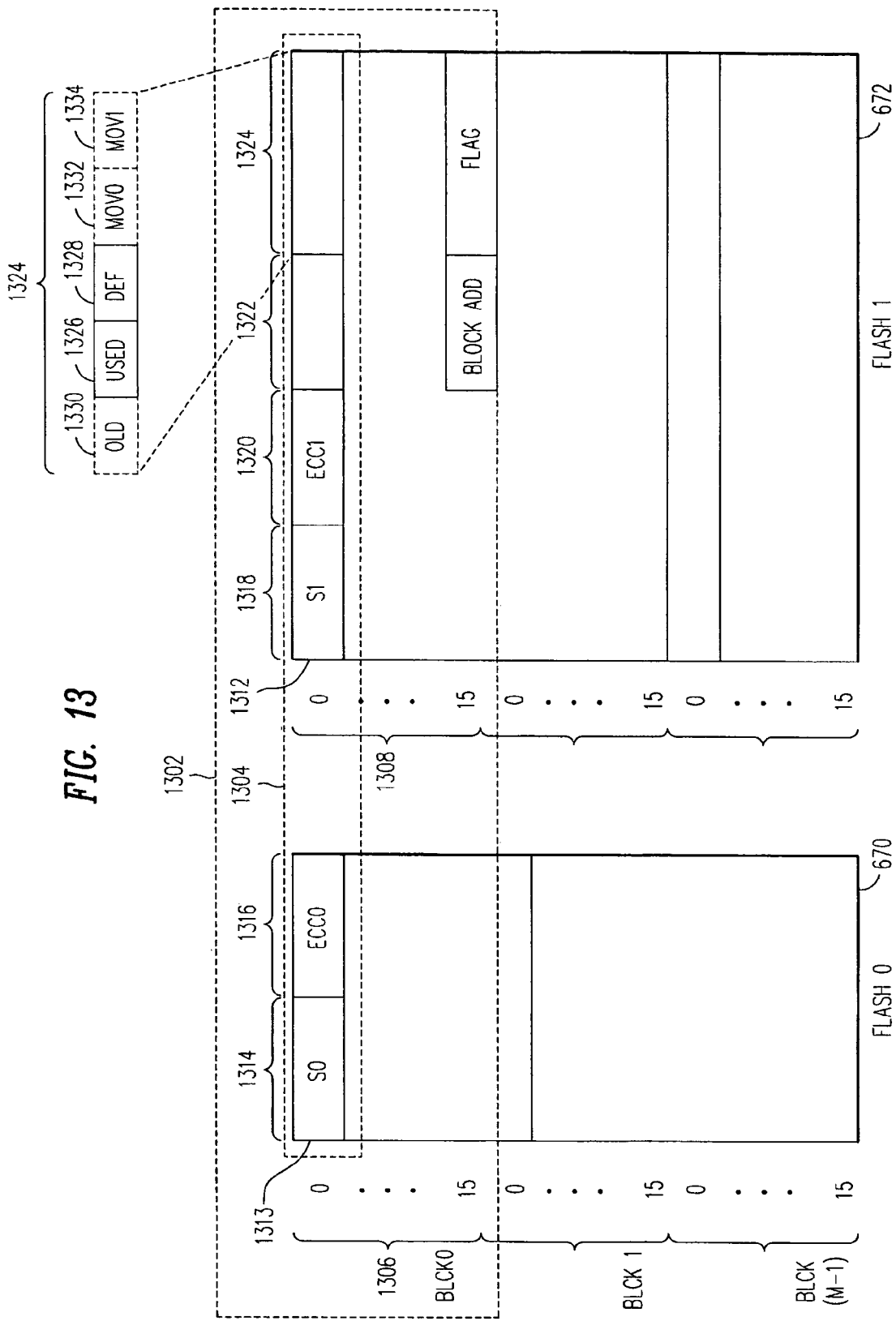

FIG. 13 is a table diagram generally illustrating an alternative memory storage format for storing a block, including 32 sectors, of information in a memory bank including two non-volatile memory units wherein an even sector and an odd sector are stored in a single memory row location and wherein an even sector is stored in a first row portion located in a first of the two memory units and an odd sector is stored in a second row portion located in the second of the two memory units.

Figure 14:
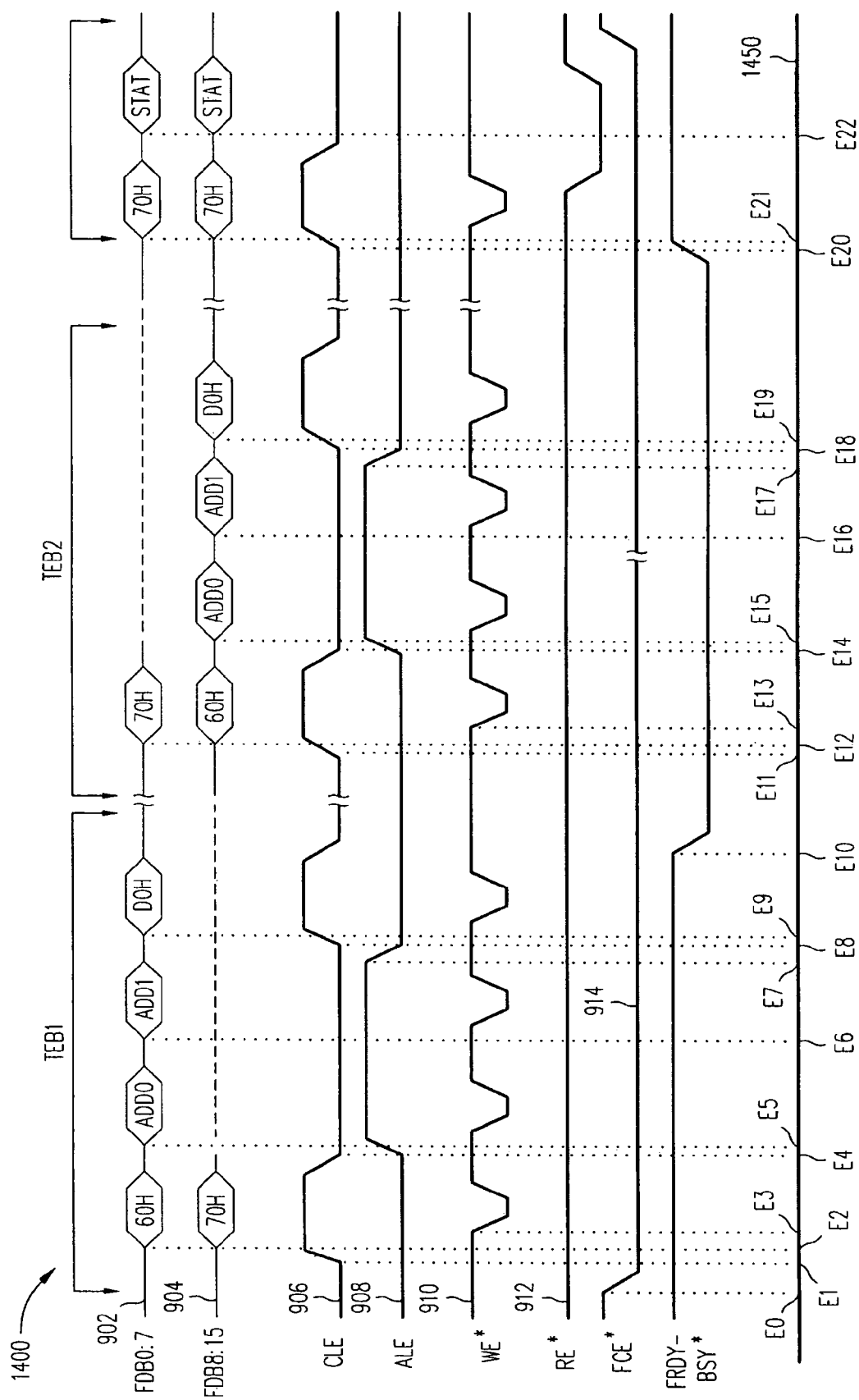

FIG. 14 shows a timing diagram illustrating the timing of control, address, and data signals for a process of erasing a block of a memory bank in accordance with principles of the present invention.

Figure 15:
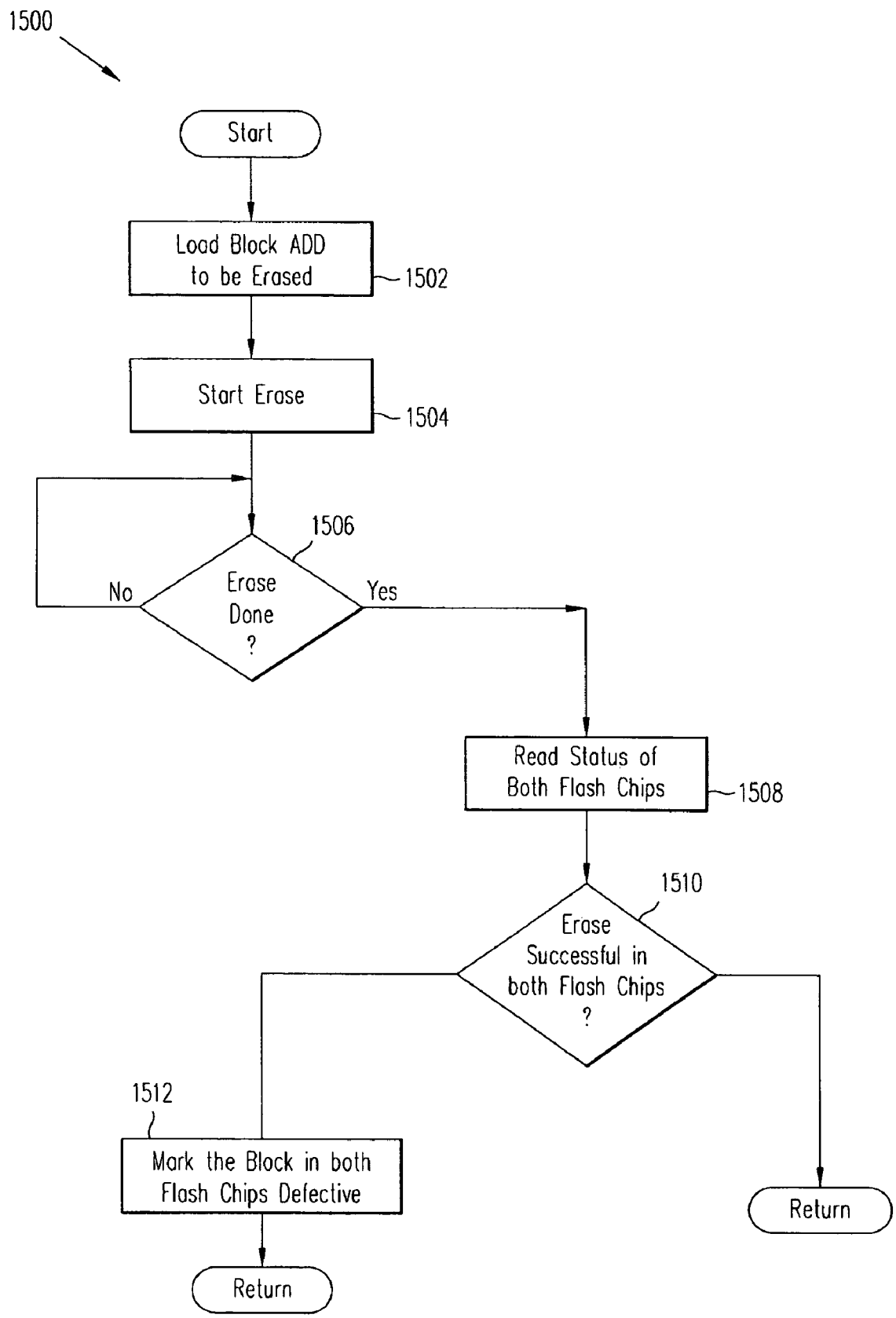

FIG. 15 is a flowchart illustrating a process of erasing a block, including a first sub-block stored in a first memory unit and a second sub-block stored in a second memory unit, in accordance with the present invention.

DETAILED DESCRIPTION OF THE PREFERRED EMBODIMENT

Figure 1:
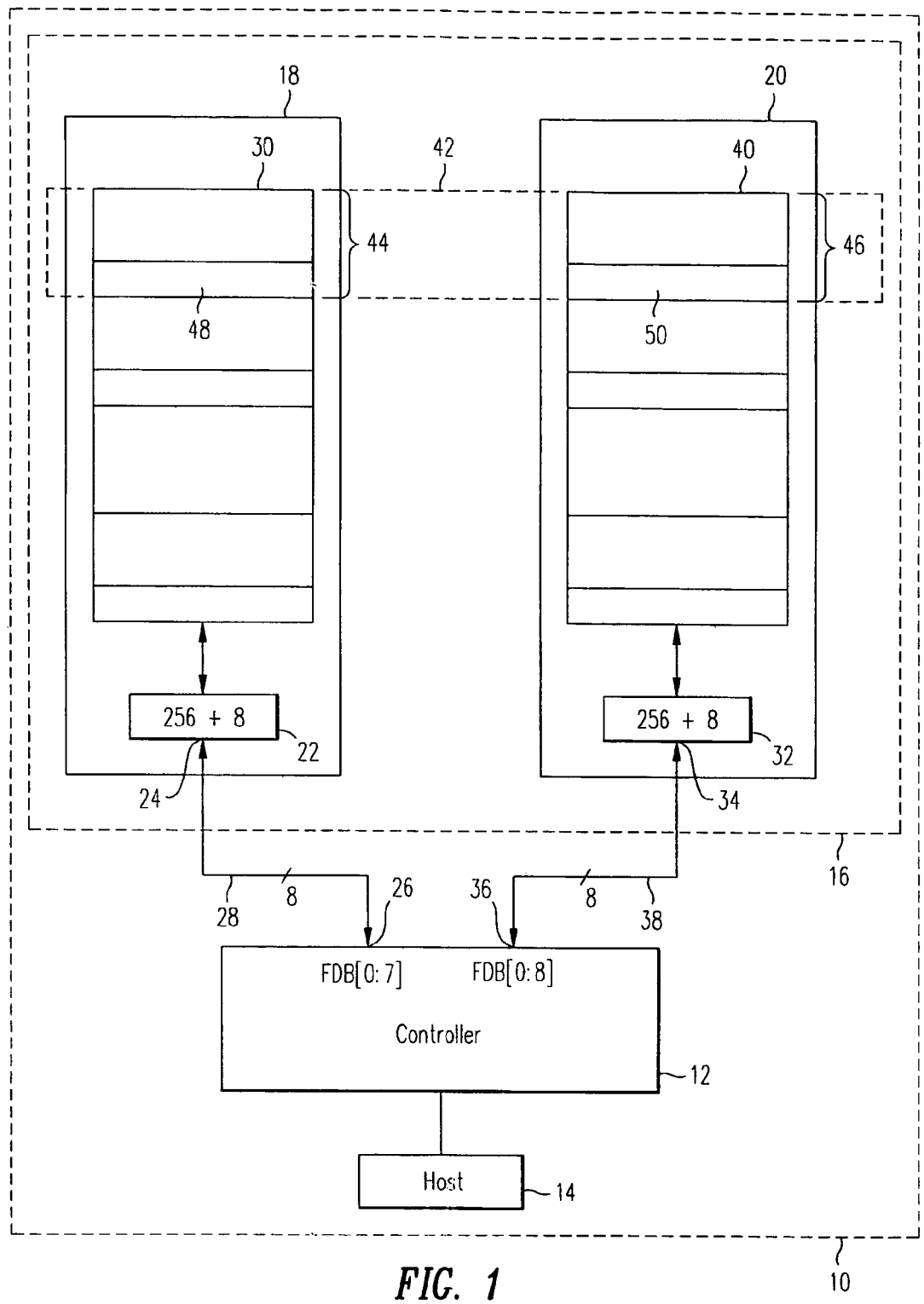
FIG. 1 is a block diagram of a prior art memory system in which a single sector of information is written, two bytes at a time during a write operation, to a memory bank including two memory units each having capacity to store 256 bytes of user data in a single row location.
Figure 2:
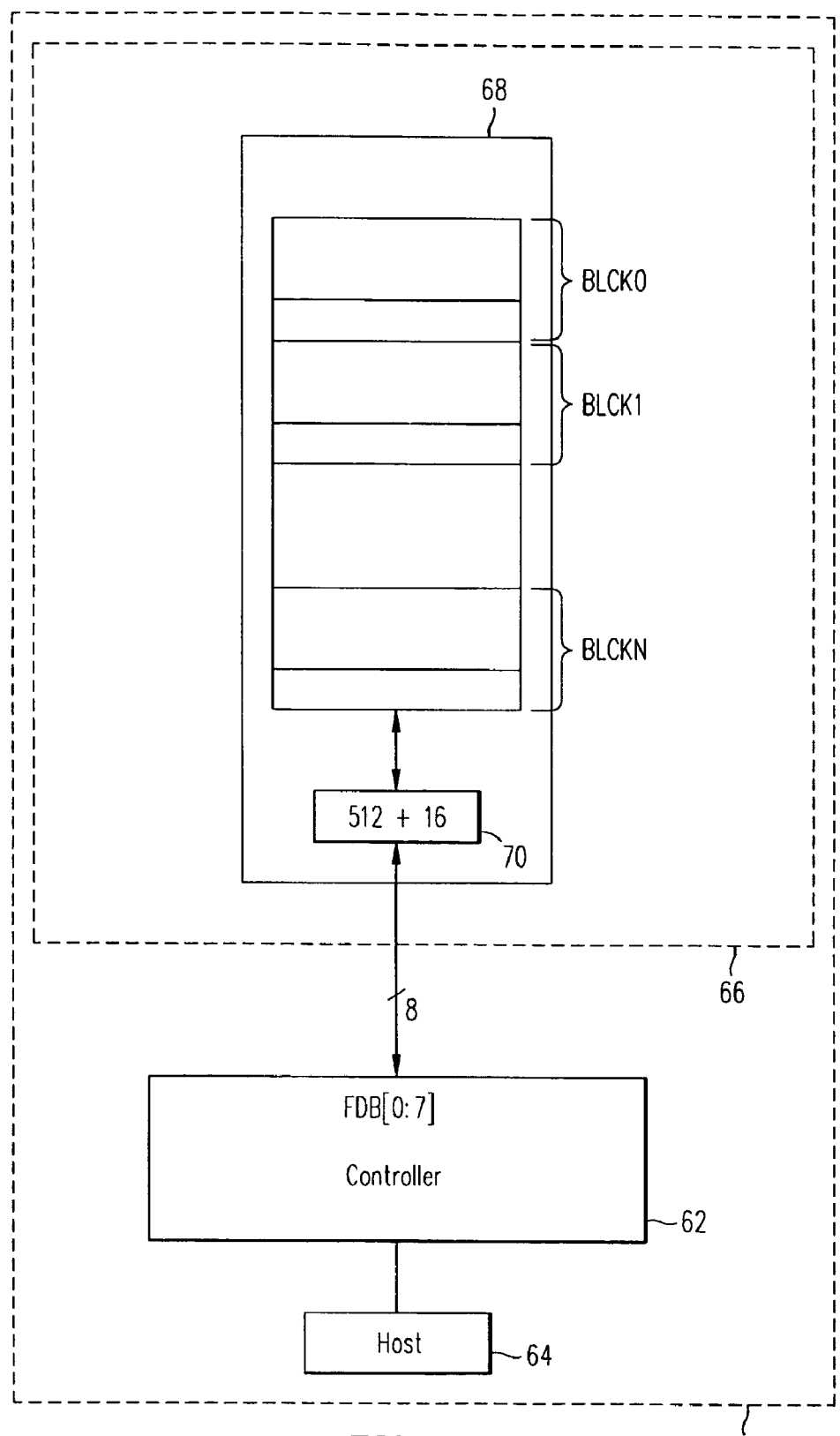
FIG. 2 is a block diagram of a prior art memory system in which a single sector of information is written, one byte at a time during a write operation, to a memory bank including at least one memory unit having capacity to store 512 bytes of user data in a single row location.
Figure 3:
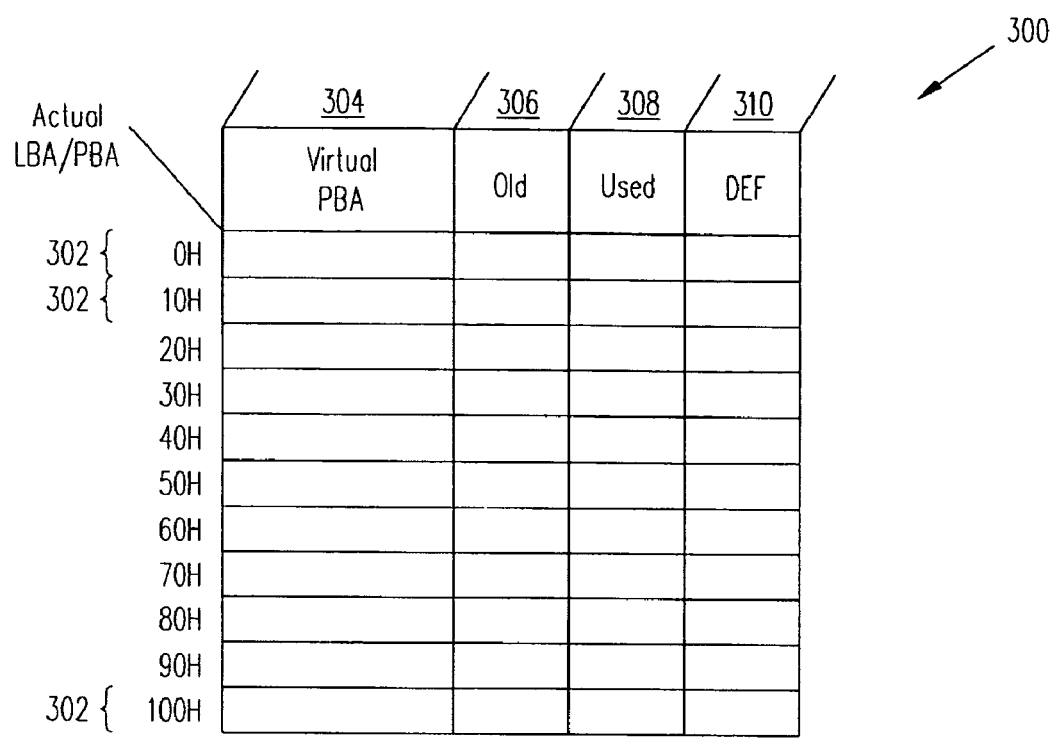
FIG. 3 is a table diagram illustrating an exemplary map for translating a host-provided logical block address (LBA) identifying a sector of information to a physical block address (PBA) identifying a location for the sector within a memory bank.
Figure 4:
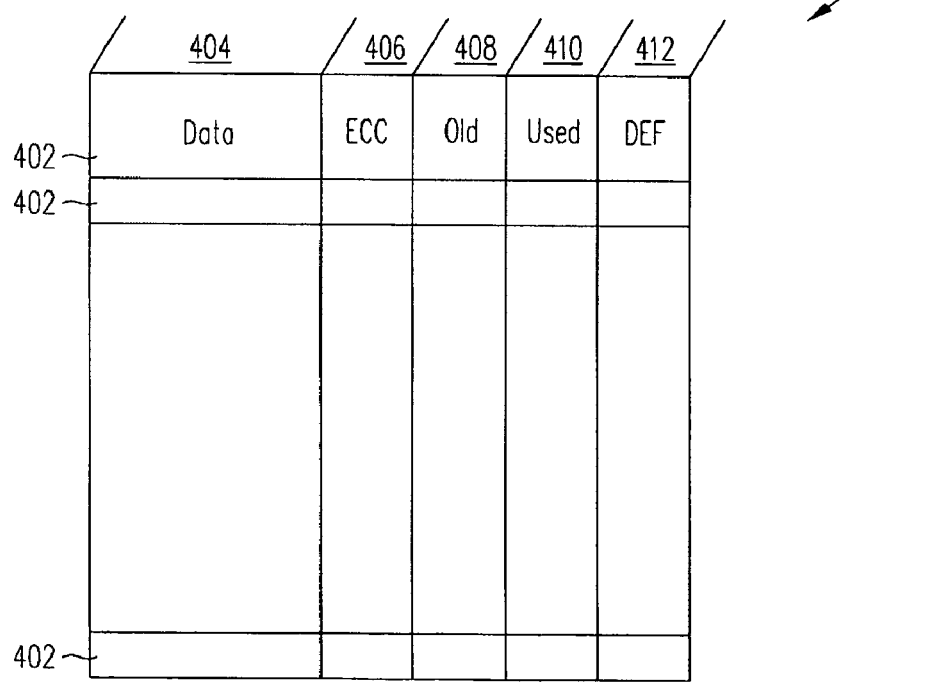
FIG. 4 is a table diagram illustrating an exemplary format for storage of a sector of data maintained in a memory bank.
Figure 5:
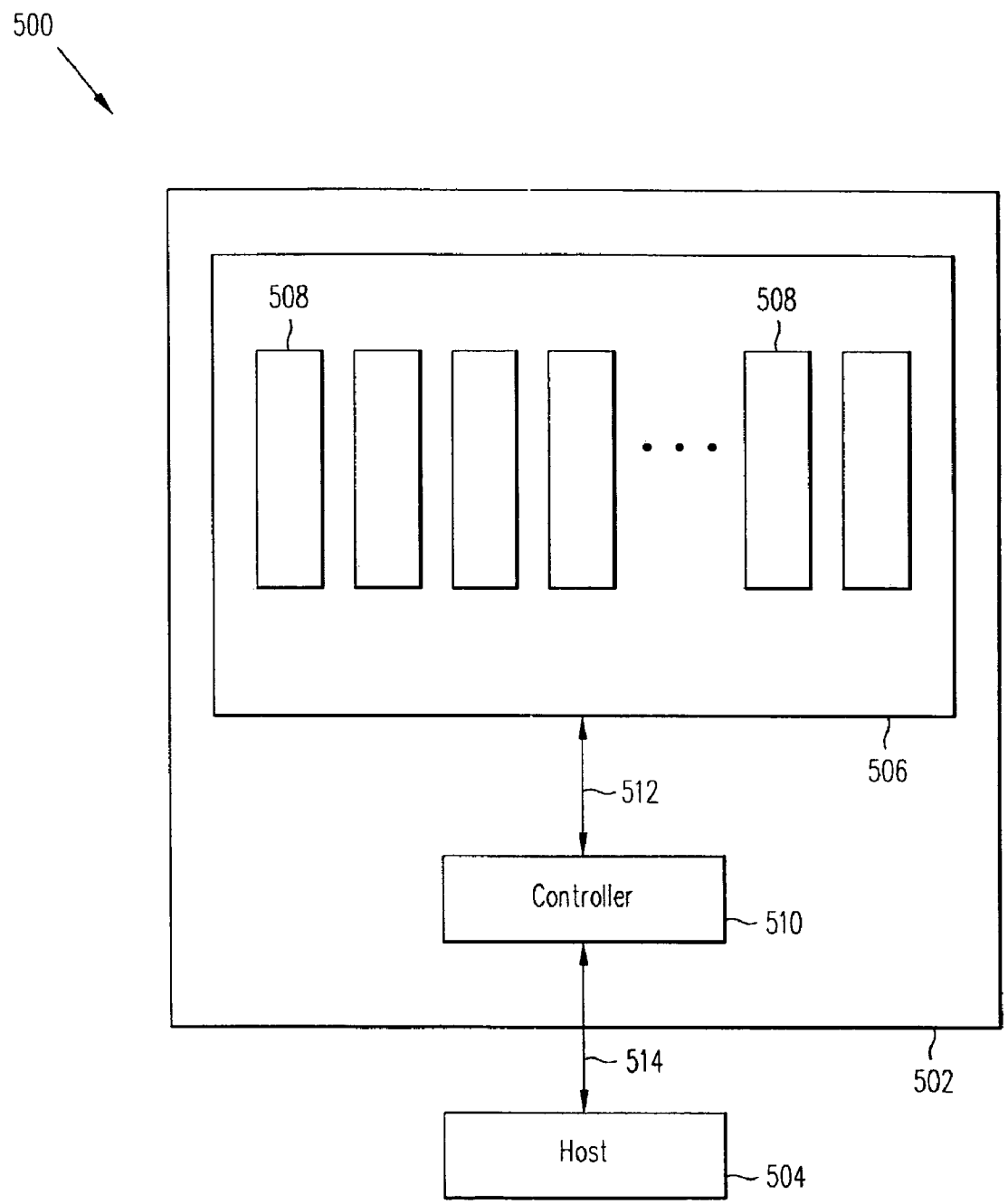
FIG. 5 is a generalized block diagram of a memory system in accordance with the present invention in which two sectors of information are written, two bytes at a time during a single write operation, to a memory bank including at least two memory units each having capacity to store 512 bytes of user data in a single row location.

FIG. 5 shows a-generalized block diagram at 500 of a memory system in accordance with principles of the present invention. The system includes a memory card 502 coupled to a host system 504. In one embodiment, host 504 is a digital camera and memory card 502 is a digital film card, and in another embodiment, host 504 is a personal computer system and memory card 502 is a PCMCIA card. Memory card 502 includes: a non-volatile memory bank 506 including a plurality of non-volatile memory units 508 for storing sectors of information organized in blocks; a memory controller 510 coupled to the memory bank via a memory bus 512, and coupled to the host 504 via a host bus 514. Memory controller 510 controls transfer of sector-organized information between host 504 and memory bank 506. Each sector of information includes a user data portion and an overhead portion. The memory controller performs write and read operations, in accordance with the present invention, to and from the memory units of the memory bank as further explained below.

In the present invention, the non-volatile memory bank 506 may include any number of non-volatile memory-units 508 while in a preferred embodiment, the non-volatile memory bank has an even number of memory units. Also in the preferred embodiment, each of the non-volatile memory units is a flash memory integrated circuit device.

FIG. 6 shows a detailed block diagram at 600 of the memory system of FIG. 5. Controller 510 is shown to include: a host interface 610 connected to the host 504 via host bus 514 for transmitting address, data, and control signals between the controller and the host; a data buffer 614 having a port 616 coupled to a port 618 of the host interface; a microprocessor 620 having a port 622 coupled to a port 624 of the host interface; a code storage unit 626 having a port 628 coupled to a port 630 of the microprocessor; a boot ROM unit 632 having a port 634 coupled to port 630 of the microprocessor and to port 628 of the code storage unit; a space manager 636 having a port 638 coupled to a port 640 of the microprocessor; a flash state machine 642 including a port 644 coupled to a port 646 of the microprocessor, a port 648 coupled to a port 650 of the space manager, and a port 645 coupled to a port 647 of the data buffer, a memory input/output unit 652 having a port 654 coupled to a port 656 of the flash state machine; an error correction code logic unit (ECC logic unit) 660 having a port 662 coupled to a port 664 of the flash state machine, and a port 666 coupled to a port 668 of the data buffer 614.

In the depicted embodiment, memory bank 506 includes two non-volatile memory units (although additional memory units may be included, only two are shown for simplicity); a first flash memory chip 670 designated FLASH0 and a second flash memory chip 672 designated FLASH1. First flash memory chip 670 includes a first input/output register (first I/O register) 671 and a storage area 669. Second flash memory chip 672 includes a second input/output register (second I/O register) 673 and a storage area 674.

Memory bus 512 is used to transmit address, data, and control signals between the controller 510 and memory bank 506. Memory bus 512 includes a flash bus 675 connected to a port 676 of memory I/O unit 652 for transmitting address, data, and command signals between flash memory chips 670, 672 and the memory I/O unit 652. Flash bus 675 includes 16 bit lines, 8 bit lines of which form a first bus 680 connected to a port 682 of I/O register 671 of the first flash memory chip, and another 8 bit lines of which form a second bus 684 connected to a port 686 of I/O register 673 of the second flash memory chip.

Memory bus 512 also includes: a control bus 690 which connects a control signal (CTRL signal) output 692 of the flash state machine 642 to an input 694 of the first flash memory chip and to an input 696 of the second flash memory chip; a chip enable line 698 which connects a chip enable (CE) output 700 of the flash state machine 642 to an enable input 702 of the first flash memory chip and to enable an input 704 of the second flash memory chip; and a ready/busy signal (FRDY-BSY* signal) line 706 which connects an output 708 of the first flash memory chip and an output 710 of the second flash memory chip to an input 712 of the flash state machine 642:

Microprocessor 620, at times (for example, during initialization of the memory system), executes program instructions (or code) stored in ROM 632, and at other times, such as during operation of the memory system, the microprocessor executes code that is stored in code storage unit 626, which may be either a volatile, i.e., read-and-write memory (RAM) or a non-volatile, i.e., EEPROM, type of memory storage. Prior to the execution of program code from code storage unit 626, the program code may be stored in the memory bank 506 and later downloaded to the code storage unit for execution thereof. During initialization, the microprocessor 620 can execute instructions from ROM 632.

Sector-organized information, including user data and overhead information, is received at host interface 610 from host 504 via host bus 514 and provided to the data buffer 614 for temporary storage therein. Sectors of information stored in the data buffer are retrieved under control of flash state machine 642 and provided to memory bank 506 in a manner further described below. It is common in the industry for each sector to include 512 bytes of user data plus overhead information. Although a sector may include other numbers of bytes of information, in the preferred embodiment, a sector has 512 bytes of user data and 16 bytes of overhead information.

ECC logic block 660 includes circuitry for performing error coding and correction on the sector-organized information. ECC logic block 660 performs error detection and/or correction operations on the user data portions of each sector stored in the flash memory chips 670, 672 or data received from host 504.

When required, the space manager 636 finds a next unused (or free) non-volatile memory location within the memory bank for storing a block of information with each block including multiple sectors of information. In the preferred embodiment, a block includes 32 sectors although, alternatively a block may be defined to include another number of sectors such as, for example, 16. The physical address of a storage block located within memory bank 506, referred to as a virtual physical block address (virtual PBA), and the physical block address of a sector of information located within the memory bank 506, referred to as an actual physical block address (actual PBA), is determined by the space manager by performing a translation of a logical block address (LBA) received from the host. An actual LBA received from host 504 (a host-provided LBA) identifies a sector of information. Space manager 636 includes a space manager memory unit, which is preferably a volatile memory unit, for storing an LBA-PBA map for translating a modified version of the host-provided LBAs to virtual PBAs as further explained below. In the depicted embodiment, the space manager includes a space manager RAM unit (SPM RAM unit) 720 for storing the LBA-PBA map under the control of a space manager controller (SPM controller) 724 which is coupled to the SPM RAM unit.

FIG. 7 shows a table diagram generally illustrating organization of user data, error correction information, and flag information stored in memory bank 506 in accordance with an embodiment of the present invention. Memory bank 506 includes a plurality of M blocks 727 designated BLCK0, BLCK1, BLCK(M−1), each having a virtual physical block addresses (PBA). Each of the blocks 727 includes a plurality of N memory row locations 728 designated ROW0, ROW1, . . . ROW15 where, in the preferred embodiment, N=16. Each block 727 of memory bank 506 is comprised of a first sub-block 730 of first flash memory chip 670, and a corresponding second sub-block 731 of second flash memory chip 672. Corresponding sub-blocks 730, 731, which together form a block, are identified by the same virtual PBA. Each memory row location 728 includes a first row-portion 732 and a corresponding second row-portion 733 In the depicted embodiment each of the first and second row-portions 732, 733 includes storage for 512 bytes of data information plus additional storage space for other information. In the depicted embodiment, the storage of information in the first row-portions 732 of the first flash memory chip is accomplished in a manner dissimilar from that in the second row-portions 733 of the second flash memory chip.

Each of the first row-portions 732 includes: a first even sector field 734 for storing even data bytes D0, D2, D4, . . . D510 of an even sector (S0, S2, S4, . . . ) of information; a first spare field 736; a first odd sector field 738 for storing even data bytes D0, D2, D4, . . . D510 of an odd sector (S1, S3, S5, . . . ) of data; and a second spare field 740. Each of the second row-portions 733 includes: a second even sector field 742 for storing odd data bytes D1, D3, D5, . . . D511 of the even sector of data which has it's corresponding even data bytes stored in first even sector field 734; a first error correction field 744 for storing error correction information corresponding to the even sector 6f information stored collectively in fields 734 and 742; a second odd sector field 746 for storing odd data bytes of the odd sector of information which has it's even data bytes stored in first odd sector field 738; a second error correction field 748 for storing ECC information corresponding to the odd sector of information stored collectively in fields 738 and 746; a block address field 750; and a flag field 752. Fields 734 and 742 form an even sector location while fields 738 and 746 form an odd sector location. It is understood in the present invention that fields 734 and 742 could alternatively form an odd sector location while fields 738 and 746 could alternatively form an even sector location, and that fields 734 and 738 could alternatively be used to store odd data bytes while fields 742 and 746 could alternatively be used to store even data bytes. Additionally, first row-portion 732 could alternatively be used for storing the overhead information relating to the sectors stored in the memory row location 728.

Flag field 752 is used for storing flag information which is used by controller 510 (FIG. 6) during access operations as further explained below. Block address field 750 is used for storing a modified version of a host-provided LBA value which is assigned to a block, as further described below: Only a single block address entry is required in the block address field per block. In a preferred embodiment, a modified host-provided LBA value is entered in block address field 759 of the Nth row, ROW 15, of the row locations 728 of each block 727.

In operation, the controller 510 (FIG. 6) accesses an even sector of information stored collectively in the first and second flash memory chips by simultaneously accessing first and second even sector fields 734, 742 of corresponding row-portions of the first and second flash memory chips via the first and second split buses 680, 684 (FIG. 6), respectively. The first and second split buses 680, 684 (FIG. 6) include lines coupled to receive the even and odd data bytes respectively of a sector of information. The controller 510 (FIG. 6) accesses an odd sector of information stored collectively in the first and second flash memory chips by simultaneously accessing the first and second odd sector fields 738, 746 via the first and second split buses 680, 684 (FIG. 6), respectively. The split buses 680, 684 (FIG. 6) also provide for: transmission of ECC information between the flash memory chips and the flash state machine 642 and ECC logic unit 660 of the memory controller 510; and transmission of address information from flash state machine 642 to the flash memory chips.

Controller 510 (FIG. 6) monitors the status of blocks 727 of memory bank 506 using the space manager 636. In one embodiment, controller 510 (FIG. 6) monitors the status of each block location 727 of the memory bank using block level flags including a used/free block flag and a defect block flag stored in a used flag location 754 and a defect flag location 756 respectively of the flag field 752. Block level flags provide information concerning the status of a whole block 727 of the memory batik and therefore, only a single block level flag entry is required in the flag locations 754 and 756 per block. The used/new block flag indicates whether the corresponding block 727 is currently being "used" to store information or whether it is available (or free) to store information. The defect block flag indicates whether the corresponding block 727 is defective.

In another embodiment, controller 510 (FIG. 6) monitors the status of each memory row location 728 of the memory bank using flags including a used/free row flag stored in the used flag location 754, a defect row flag stored in the defect flag location 756, an old row flag stored in an old flag location 758 of the flag field 752, an even sector move flag stored in an even sector move flag location 760, and an odd sector move flag stored in an odd sector move flag location 762. In this embodiment, the used/new flag indicates whether the corresponding memory row location 728 is currently being "used" to store information or whether it is available (or free) to store information. The defect flag indicates whether the memory block 727 is defective. If either of a corresponding pair of non-volatile memory locations 732, 733 is determined to be defective, then the whole memory block 727 is declared to be defective as indicated by the value in the defect flag location 756 being set, and the defective block can no longer be used. In a preferred embodiment, locations 758, 754, and 756 are included in a single 3-bit flag location 764.

The even and odd sector move flag locations 760, 762 store values indicating whether the corresponding even and odd sectors stored in the non-volatile memory sector location have been moved to another location within the non-volatile memory bank 506 (FIG. 6). For example, if an even sector of information stored collectively in a particular pair of even sector fields 734, 742 of a row location 728 has been moved to another pair of even sector fields in the non-volatile memory bank 506, the value in the corresponding even sector move flag location 760 is set. Similarly, if an odd sector of information stored collectively in the odd sector fields 738, 746 of the same row location has been moved to another pair of odd sector fields in the non-volatile memory bank, then the value in the corresponding odd sector move flag location 672 is set; The location within the non-volatile memory bank 506 to which a sector of information has been moved is indicated in the LBA-PBA map stored in the SPM RAM 720 in an MVPBA address location, as taught in a patent application, filed by the inventors of this application, entitled "Moving Sectors Within a Block of Information In a Flash Memory Mass Storage Architecture", Ser. No. 08/831,266, filed Mar. 31, 1997, the disclosure of which is incorporated herein by reference. In a preferred embodiment, locations 760 and 762 are formed by a single 2-bit move-flag location 766.

FIG. 8A shows a table diagram generally illustrating organization of an exemplary LBA-PBA map at 800, which is stored in SPM RAM 720 (FIG. 6), for translating a modified version of the host-provided LBA's to PBA's. The modified host-provided LBA is derived by dividing the host-provided LBA by the number of sectors with a block, as explained in more detail below. The depicted LBA-PBA map includes: a plurality of map row locations 802 which are addressable by a modified host-provided LBA or by a virtual PBA; a virtual PBA field 804 for storing a virtual PBA value identifying a block 727 (FIG. 7) within the memory bank; and a flag field 806 for storing flag information. As previously mentioned, the actual PBA specifies the location of a sector of information in the memory bank and the virtual PBA specifies the location of a block 727 (FIG. 7) in the memory bank. Virtual PBA values are retrieved by space manager 636 (FIG. 7) from the depicted map and transferred to port 648 of the flash state machine 642 for use in addressing blocks within memory bank 506.

FIG. 8B shows a block diagram illustrating a host-provided-LBA format 810 and an actual PBA format 820. LBA format 810 includes "offset bits" 812, which comprise the least significant bits of the host-provided LBA value. As explained above, in the preferred embodiment, each block 727 (FIG. 7) includes memory space for storing 32 sectors of information, each sector includes 512 bytes of user data and 16 bytes of overhead information. Because each block 727 (FIG. 7) includes 32 sectors in the preferred embodiment, five offset bits 812 are required to identify each of the 32 sectors in each block. In this embodiment, the translation of the host-provided-LBA to actual and virtual PBA values is performed by first masking the five least significant "offset" bits 812, of the host-provided-LBA, shifting the result to the right by 5 bits and using the shifted value as a modified host-provided LBA value or an "LBA-map-value" to address a map row location 802 in the LBA-PBA map 800 (FIG. 8A). This, in effect, is dividing the host-provided LBA by 32. The actual PBA value 820, which specifies the location of a sector within a block of the memory bank, is formed by concatenating offset bits 812 of the LBA value with a virtual PBA 822 value stored in the corresponding field 804 (FIG. 8A) of the LBA-PBA map. That is, the virtual PBA value 822 is used to identify a block within the memory bank and the five remaining offset bits 812 are used to address a sector within the identified block.

Upon initialization of memory system 600 (FIG. 6), the virtual PBA value stored in the virtual PBA field 804 of each map row location 802 is set to an all '1's state. Each time a block 727 (FIG. 7) is accessed by the controller, such as during a write operation, the virtual PBA value stored in the corresponding virtual PBA field 804 of the corresponding map row location is modified by the space manager controller 724 (FIG. 6) to specify a new virtual PBA value. When a block within the memory bank 506 is erased, the old virtual PBA value (the virtual PBA value corresponding to the erased block), rather than a modified version of the host-provided LBA; is used to address the SPM RAM 720 (FIG. 6) and the used flag, stored within the flag field of the SPM RAM 720, is cleared. This same 'used' flag within the flag field of the SPM RAM 720 is set at the time when the corresponding virtual PBA is updated pointing to the new block in the memory bank where sector information is maintained (step 1214).

FIG. 9 shows a timing diagram illustrating the timing of control, address, and data signals for a write operation performed by memory system 600 (FIG. 6) wherein two sectors of information are simultaneously written in the non-volatile memory bank 506 (FIG. 6) during a single write operation. The diagram includes: a wave form 902 representing a first flash signal which transmits time multiplexed command, address, and data information from flash state machine 642 (FIG. 6) of the controller via bus 680 (FIG. 6) to port 682 of the first flash memory chip; a wave form 904 representing a second flash signal which transmits time multiplexed command, address, and data signals from the flash state machine via bus 684 (FIG. 6) to port 686 of the second flash memory chip; a time line 905; and a plurality of control signal wave forms.

The control signal wave forms include: a wave form 906 representing a command line enable signal (CLE signal) transmitted from flash state machine 642 (FIG. 6) to the first and second flash memory chips via control bus 690 (FIG. 6); a wave form 908 representing an address line enable signal (ALE signal) transmitted from the flash state machine to the flash memory chips via the control bus; a wave form 910 representing a write enable signal (WE signal) transmitted from the flash state machine to the flash memory chips via the control bus; a wave form 912 representing a read enable signal (RE signal) transmitted from the flash state machine to the memory chips via the control bus; a wave form 914 representing a flash chip enable signal (FCE* signal) transmitted from chip enable signal output 700 (FIG. 6) of the flash state machine via chip enable line 698 to the first and second flash memory chips; a wave form 916 representing a flash ready/busy signal (FRDY_BSY* signal) transmitted from outputs 708 and 710 (FIG. 6) of the first and second flash memory chips to the flash state machine via flash ready/busy signal line 706.

The write operation commences at a time t0 at which the FCE* signal (wave form 914) transitions from a HIGH state to a LOW state thereby enabling the first and second flash memory chips to begin receiving command, address, data, and control signals. Prior to time t0, the FRDY_BSY* signal (wave form 916), transmitted from the flash memory chips to input 712 of the flash state machine (FIG. 6), is already activated indicating that the first and second flash memory chips are ready to receive access commands. At a subsequent time t1, the CLE signal (wave, form 906) is activated, transitioning from a LOW state to a HIGH state, thereby enabling the first and second flash memory chips to read command signals. At a time t2, the first and second flash signals (wave forms 902 and 904) simultaneously transmit a serial data shift-in command signal 80H to the first and second flash memory chips via the first and second first split buses 680 and 684 respectively. At a time t3, while the serial data shift-in command signals 80H are active, the WE signal (wave form 910) transitions from a HIGH state to a LOW state thereby enabling the first and second flash memory chips to read the serial data command signals 80H. At a time t4, the CLE signal (wave form 906) is deactivated, transitioning back to the LOW state, thereby disabling the flash memory chips from reading command signals.

Also at time t4, the ALE signal (wave form 908) is activated, transitioning from a LOW state to a HIGH state, thereby enabling the first and second flash memory chips to read packets of address information. At times t5, t6, and t7, the first and second flash signals (wave forms 902 and 904) each transmit first, second, and third address packets ADD0, ADD1, and ADD2 respectively to the first and second flash memory chips. At a time t8, the ALE signal (wave form 908) is deactivated, transitioning from the HIGH state to a LOW state, thereby disabling the first and second flash memory chips from reading address information. During time intervals between times t5 and t6, t6 and t7, and t7 and t8, the WE signal (wave form 910) transitions from a HIGH state to a LOW state thereby enabling the first and second flash memory chips to read the read first, second, and third address packets ADD0, ADD1, and ADD2 respectively. The three address packets ADD0, ADD1, and ADD2 specify a row-portion 732, 733 within a first sub-block 730 (FIG. 16).

At a time t9, the first and second flash signals (wave forms 902 and 904) begin simultaneously transmitting interleaved even and odd data bytes wherein the even and odd bytes form one sector of information. The even bytes are transmitted to the first flash memory chip via bus 680 (FIG. 6) and the odd sector bytes are transmitted to the second flash memory chip via bus 684 (FIG. 6). The even data bytes D0, D2, D4, . . . D510 of the even sector are received by the first flash chip and stored in the first even sector field 734 (FIG. 16) of the corresponding location 732 of the first flash memory chip. This is done by storing a byte each time the write:enable signal WE* (Wave form 910) is activated. The odd data bytes D1, D3, D5, . . . D511 of the even sector are received by the second flash chip and stored in the second even sector field 742 (FIG. 16) of the corresponding location 733 thereof with each byte being stored when the WE* signal is activated. At a time t10, the first and second flash signals (wave forms 902 and 904) complete transmission of the interleaved even and odd data bytes of the even sector.

Immediately after time t10, during an interval between time t10 and a time t11, the first flash signal (wave form 902) transmits four packets of filler information (FFH, hexadecimal F, equivalent binary value "1111," decimal value "15") to the first flash memory chip via the first split bus 680 (FIG. 6) while the second flash signal (wave form 904) transmits error correction codes (ECC) to the second flash memory chip via the second split bus 684 (FIG. 6). The filler information FFH transmitted during this time period is received by the first flash memory chip and stored in the first spare field 736 (FIG. 16). The error correction code transmit ted during this time period is received by the second flash memory chip and stored in the first error correction field 744 (FIG. 16) of the nonvolatile memory section 733 of the second flash memory chip.

This error correction code, generated by ECC logic unit 660 (FIG. 16), relates to the even sector transmitted during the preceding time interval between time t10 and t11.

At a time t11, the first and second flash signals (wave forms 902 and 904) begin simultaneously transmitting interleaved even and odd data bytes, synchronous with the write enable signal WE* (wave form 910), of an odd sector to the first and second flash memory chips via the first and second first split buses 680 and 684 (FIG. 6) respectively. The even data bytes D0, D2, D4, . . . D510 of the odd sector are received by the first flash chip and stored to the first odd sector field 738 (FIG. 16) of the corresponding location 732 of the first flash memory chip. The odd data bytes D1, D3, D5, . . . D511 of the odd sector are received by the second flash memory chip and stored to the second odd sector field 746 (FIG. 16) of the corresponding location 733 of the second flash memory chip. At a time t12, the first and second flash signals (wave forms 902 and 904) complete transmission of the interleaved even and odd data bytes of the odd sector.

Immediately after time t12, during an interval between time t12 and a time t13, the first flash signal (wave form 902) transmits no information to the first flash memory chip thereby maintaining the value in corresponding storage location bytes of the first flash memory chip at FFH (hexadecimal) or all 1's in binary. Meanwhile, between time t12 and time t13, while the second flash signal (wave form 904) transmits error correction codes (ECC) to the second flash memory chip via the second split bus 684 (FIG. 6). The filler information FFH transmitted during this time, period is received by the first flash memory chip and stored to the second spare field 740 (FIG. 16). The error correction code transmitted during this time period is received by the second flash memory chip and stored to the second error correction field 748 (FIG. 16) of the nonvolatile memory section 733 of the second flash memory chip. This error correction code, generated by ECC logic unit 660 (FIG. 16), relates to the odd sector transmitted during the preceding time interval between time t11 and t12.

At a time t17, the first and second flash signals (wave forms 902 and 904) each transmit a read command signal 70H to the first and second first and second flash memory chips via the first and second split buses 680 and 684 respectively. While the read command signals 70H are active, the WE signal (wave form 910) transitions from a HIGH state to a LOW state thereby enabling the first and second flash memory chips to read the read command signals 70H. At a time t18, the CLE signal (wave form 906) is deactivated, transitioning back to the LOW state, thereby disabling the flash memory chips from reading command signals.

At a time t18, the first and second flash signals (wave forms 902 and 904) each transmit a status command signal STATUS to the first and second first and second flash memory chips via the first and second split buses 680 and 684 respectively. While the read command signals 70H are active, the WE signal (wave form 910) transitions from a HIGH state to a LOW state thereby enabling the first and second flash memory chips to read the read command signals 70H.

FIG. 10 shows a table diagram generally illustrating the memory storage format, as depicted in FIG. 7, for storing a block of information in memory bank 506 (FIG. 6) wherein a single sector is written to a particular memory row location of the memory bank. As shown, a memory row location 728 designated ROW1 has an even sector S2 and an odd sector S3 stored therein in accordance with the format described above in reference to FIG. 7. A memory row location 728 designated ROW2 has a single even sector S4 stored in the first and second even sector fields 734 and 742 of a corresponding pair of row-portions of the first and second flash memory chips 670, 672. Because no odd sector is required to be stored in this case, fields 736, 738, 746, 748, 750, and 752 are shown to be erased.

FIG. 11 shows a table diagram illustrating the alternative memory storage format, as depicted in FIG. 7, for storing a block of information in memory bank 506 (FIG. 6) wherein a single sector is written to a particular memory row location of the memory bank. As mentioned above, field 764 is a three bit field which is used for storing the old row flag in the first bit place, the used/free row flag in the second bit place, and the defect row flag in the third bit place. Also as described above, field 766 is a two bit field which is used for storing the even sector move flag in the first bit place and the odd sector move flag in the second bit place.

The memory row location designated ROW1, having sectors S2 and S4 stored therein, has a value "00" stored in field 766 indicating that both sectors have been moved elsewhere in the memory bank. The memory row location designated ROW2, having a single even sector S4 stored in the first and second even sector fields 734 and 742, has a value "01" stored in field 766 indicating that the information in S4 has been updated and now resides elsewhere in the memory bank. A value of logic state "0" generally indicates that moved sectors have been updated by the host. Therefore, when the remaining sectors are moved from the old block which was not updated by the host, it can be determined that these sectors are not to be overwritten by the old data during the move.

A memory location 728 designated ROW1 has an even sector S2 and an odd sector S3 stored therein in accordance with the format described above in reference to FIG. 7. A memory location 728 designated ROW2 has a single even sector S4 stored in the first and second even sector fields 734 and 742 of a corresponding pair of row-portions of the first and second flash memory chips 670, 672. Because no odd sector is required to be stored in this case, fields 736, 738, 746, 748, 750, and 752 are shown to be erased.

FIG. 12 is a flowchart illustrating a process of simultaneously writing two sectors of information to two memory units during a single write operation in accordance with the present invention. In step 1202, the memory controller 510 (FIG. 6) receives host addressing information from host 504 which specifies addresses for one or more sector locations, in the form of a logical block address (host-provided LBA) or in the form of cylinder head sector (CHS) information. If the host addressing information is in the form of CHS information, the controller translates the CHS information to LBA information. As mentioned, the sectors are organized in blocks and therefore, the host-provided LBA's may correspond to sectors of more than one block. This information is used by microprocessor 620 (FIG. 6) as will be further discussed below.

Microprocessor 620 (FIG. 6) executes instructions, which are stored in code storage unit 626 (FIG. 6) to carry out the depicted process. In step 1204, a sector count value is set equal to the number of sector locations of a current block, being addressed by the host wherein a sector location may, for example, be comprised of fields 734 and 742 (FIG. 7) or fields 738 and 746 (FIG. 7) of the memory bank. The microprocessor determines at 1206 whether or not each of the sector locations specified by the host-provided LBA values has been accessed by the host before. This determination is made by reading the contents of the corresponding virtual PBA field 804 (FIG. 8A) of the LBA-PBA map 800 stored in SPM RAM 720 (FIG. 6). As explained above in reference to FIG. 8A, if the virtual PBA value corresponding to a host-provided LBA is set to the all '1's state, then the corresponding LBA was not accessed by the host before. Memory space in memory bank 506 is erased a block at a time. If any sectors of a block have been accessed since a last erasure of the block, then the block is indicated as having been accessed by virtue of the virtual PBA value in field 804 (FIG. 8A) of the corresponding map row location of the LBA-PBA map being a value other than "all 1's".

If it is determined that one or more sector locations, of the current block, specified by the host-provided-LBA's have been accessed previously by the host, the write process proceeds to step 1210 in which microprocessor 620 (FIG. 6) sets the corresponding one of the move flags 760, 762 (FIG. 7) corresponding to the current sector location, and the write process proceeds to step 1208. As earlier discussed, maintaining the 'move' flag in non-volatile memory is optional and may be entirely eliminated without departing from the scope and spirit of the present invention. In the absence of move flags, the microprocessor maintains the status of sectors as to whether or not they have been moved to other blocks. This is done by keeping track of two values for each block. One value is the starting sector location within a block where sectors have been moved and the second value is the number sectors within the block that have been moved. With these two values, status information as to whether or not and which sectors of a block have been moved to other block(s) may be reconstructed.

If it is determined, at step 1206, that none of the sector locations of the current block specified by the host-provided-LBA have been previously accessed, the write process proceeds directly to step 1208.

In step 1208, the space manager 636 (FIG. 6) of the controller searches for a free (or unused) block, such as block 727 (FIG. 7) located within the nonvolatile memory bank, each free block being identified by a specific virtual PBA value. The microprocessor determines at 1212 whether a free block is located, and if not, an error is reported by the controller 510 (FIG. 6) to the host indicating that the nonvolatile memory bank is unable to accommodate further storage of information. As this can result in a fatal system error, the inventors of the present invention have exercised great care in preventing this situation from occurring.

Once a free block within the nonvolatile memory is located at step 1208, the depicted process proceeds to step 1214. In step 1214, microprocessor 620 prompts space manager 636 (FIG. 6) to assign a virtual PBA value 822 (FIG. 8B) to the free block found in step 1208. This virtual PBA value is stored in the LBA-PBA map 800 (FIG. 8A) in a map row location 802 (FIG. 8A) identified by the masked bits 814 (FIG. 8B) of the host-provided LBA corresponding to the current block. The masked bits 814 (FIG. 8B) of the current host-provided LBA are obtained by shifting the host-provided LBA to the right by the 5 offset bits (or by dividing by 32). For example, if the host-identified LBA is 16H (hexadecimal notation), the row in which the virtual PBA is stored is row 0. Also at step 1214, the microprocessor appends the 'offset' bits 812 (FIG. 8B) to the virtual PBA corresponding to the found free block to obtain an actual PBA value 820 (FIG. 8B). At 1216, the microprocessor determines whether the actual PBA value is an even or odd value. At 1216, alternatively, the host-provided LBA may be checked in place of the actual PBA value to determine whether this value is odd or even.

If it is determined at 1216 that the actual PBA value is even, the process proceeds to 1218 at which the microprocessor determines whether the sector count is greater than one, i.e., there is more than one sector of information to be written at the point the controller requests that more than one sector to be transferred from the host to the internal buffer of the controller and the process proceeds to 1232 at which the microprocessor determines whether two sectors of information have been transferred from the host to the data buffer 614 (FIG. 6) (through the host interface circuit 610). That is, where there is more than one sector of information that needs to be written to nonvolatile memory, as detected by the flash state machine 642, two sectors of information are transferred at-a-time from the host to the data buffer 614. The data buffer 614 is used to temporarily store the sectors' information until the same is stored into the memory bank 506. In the preferred embodiment, each sector includes 512 bytes of user data and 16 bytes of overhead information.

Where two sectors of information have not yet been transferred to the data buffer 614, the microprocessor waits until such a transfer is completed, as shown by the 'NO' branch loop at 1232.

At step 1234, the microprocessor initiates the writing of the two sectors that have been temporarily saved to the data buffer to the memory bank 506 (FIG. 6) by issuing a write command, followed by address and data information. The write operation at step 1234 is performed according to the method and apparatus discussed above relative to FIGS. 7 and 9.

Upon completion of writing two sectors of information, the write operation is verified at 1235. If information was not correctly programmed into the sectors at step 1234, the process continues to step 1237 where a defect management routine is performed, as will be discussed in greater detail below. After execution of the defect management routine, the sector count is decremented by two at step 1236. At 1235, if the write operation was verified as being successful, step 1236 is executed and no defect management is necessary. The microprocessor then determines at 1238 whether the sector count is equal to zero and if so, it is assumed that no more sectors remain to be written and the process proceeds to 1228. If, however, more sectors need to be written the process proceeds to step 1240 at which the host-provided LBA is incremented by two to point to the next sector that is to be written.

At step 1240, the microprocessor determines whether the last sector of the block has been reached. The block boundary is determined by comparing the 'offset' value of the current LBA to the number of sectors in a block, and if those values are equal, a block boundary is reached. For example, in the preferred embodiment, since a block includes 32 sectors, the 'offset' value of the current LBA is compared against '32' (in decimal notation). If alternatively, a block is defined to have other than 32 sectors, such as 16 sectors, the latter is compared against the 'offset'. If a block boundary in the nonvolatile memory is reached, the write process continues from step 1206 where the virtual PBA value corresponding to the current LBA value is checked for an all '1's condition and so on. If a block boundary is not reached at step 1242, the write process continues from step 1218.

At step 1218, if it is determined that the sector count is not greater than one, the microprocessor proceeds to determine at 1220 whether data buffer 614 (FIG. 6) has received at least one sector of information from the host. If not, the microprocessor waits until one sector of information is transferred from the host to the data buffer 614. Upon receipt of one sector of information, writing of the next sector is initiated and performed at step 1222 according to the method and apparatus discussed above relative to FIGS. 10 and 11. Upon completion of writing a sector of information, the write operation is verified at 1223. If information was not correctly programmed into the sector at step 1222, the process continues to step 1225 where a defect management routine is performed, as will be discussed in greater detail below. After execution of the defect management routine, at step 1224, the sector count is decremented by one. If at 1223, it is determined that the write operation was correctly performed, the process continues to step 1224 and no defect management routine is executed. At 1226, the microprocessor determines whether the sector count is equal to zero and, if not, the host-provided LBA is incremented by one and the write process continues to step 1242 where the microprocessor checks for a block boundary as, explained above.

If at step 1226, as in step 1238, it is determined that no more sectors remain to be written, i.e. the sector count is zero, the depicted process proceeds to 1228 at which the microprocessor determines whether the move flag is set. As noted above, the move flag would be set at step 1210 if it was determined at 1206 that an LBA was being re-accessed by the host.

If it is determined at 1228 that the move flag is not set, the write process ends. However, upon a determined at 1228 that the move flag is set, the block is updated. That is, those sectors of the current block that were not accessed are moved to corresponding sector locations in the block within memory bank 566 identified by the virtual PBA value assigned in step 1214 to the free block found in step 1208. This is perhaps best understood by an example.

Let us assume for the purpose of discussion that the sectors identified by LBAs 1, 2, 3, 4, 5 and 6 have already been written and that the host now commands the controller to write data to sectors identified by LBAs 3, 4 and 5. Further, let us assume that during the first write process when LBAs 1-6 were written, they were stored in a block location in the memory bank 506 (FIG. 6) identified by a virtual PBA value of "3" and the LBA locations 3, 4 and 5 are now (during the second write process) being written to a location in the memory bank identified by a virtual PBA value of "8". During writing of locations identified by host-provided LBA values of 3, 4, and 5, the microprocessor at step 1206 determines that these block locations are being re-accessed and the move flag at 1210 is set. Furthermore, at step 1230, after the sectors, identified by host-provided LBAs 3, 4, and 5, have been written to corresponding sectors of the block identified by virtual PBA "8", sectors in the block identified by virtual PBA "3" that were not re-accessed during the write operation are moved from the block identified by virtual PBA "3" to corresponding sector locations of the block identified by virtual PBA "8" and the block identified by virtual PBA "3" is thereafter erased. This example assumes that remaining sectors of the block identified by virtual PBA "3", such as sectors 0 and 7-31 (assuming there are 32 sectors in a block), were not accessed since the last erase of the block in which they reside and therefore contain no valid sector information. Otherwise, if those sectors were previously accessed, then they would also be moved to the virtual PBA location 8.

Step 1230 may be implemented in many ways. The inventors of the present invention disclose various methods and apparatus which may be alternatively employed for performing the move operation of step 1230. In patent applications, Ser. No. 08/946,331 entitled "Moving Sequential Sectors Within a Block of Information In a Flash Memory Mass Storage Architecture", filed on Oct. 7, 1997, and Ser. No. 08/831,266 entitled "Moving Sectors Within a Block of Information In a Flash Memory Mass Storage Architecture", filed on Mar. 31, 1997, the disclosures of which are herein incorporated by reference.

FIG. 12*a* shows the steps performed by the microprocessor if the defect management routine at steps 1237 and 1225 (in FIG. 12) is executed. The block management routine is executed when the write operation is not successfully verified; the block(s) being programmed is in some way defective and a different area in the nonvolatile memory, i.e. another block need be located for programming therein.

At step 1600, the block that was being unsuccessfully programmed is marked as "defective" by setting the "defect" flags 756 (in FIG. 7). At step 1602, the space manager within the controller is commanded to find a free block. At step 1604, the information that would have been programmed at steps 1234 and 1222 (in FIG. 12) i.e. the block marked "defective" is programmed into corresponding sector locations within the free block found in step 1602.

At step 1606, the block marked "defective" is checked for the presence of any sector information that was previously written thereto successfully. If any such sectors exist, at step 1608, these previously-programmed sectors are moved to the free block, as is additional block information in the process of FIG. 12.

FIG. 13 shows a table diagram generally illustrating a memory storage format for storing a block, including 32 sectors, of information in memory bank 506 in accordance with an alternative embodiment of the present invention. In this embodiment, an even sector is stored in a first row portion located in a first of the two memory units and an odd sector is stored in a second row portion located in the second of the two memory units. In the depicted embodiment, memory bank 506 includes a plurality of M blocks 1302 designated BLCK0, BLCK1, BLCK(M−1) each having a physical block addresses (PBA). Each of the blocks 1302 includes a plurality of N memory row locations 1304, and in a preferred embodiment, N=16. Each block 1302 of memory bank 506 is comprised of a first sub-block 1306 of first flash memory chip 670, and a corresponding second sub-block 1308 of second flash memory chip 672 wherein the corresponding sub-blocks are identified by the same virtual PBA. Each memory row location 1304 includes a first row-portion 1310 and a corresponding second row-portion 1312. In the depicted embodiment each of the first and second row-portions 1310, 1312 includes storage for 512 bytes of data information plus additional storage space for error correction information (ECC information) and flag information.

Each of the first row-portions 1310 includes an even sector field 1314 for storing an even sector (S0, S2, S4, . . . ) of information, and an even sector error correction field 1316 for storing error correction information corresponding to the even sector stored in field 1314. Each of the second row-portions 1312 includes an odd sector field 1318 for storing an odd sector (S1, S3, S5, . . . ) of information, an odd sector error correction field 1320 for storing error correction information corresponding to the odd sector stored in 1318, a block address field 1322, and a flag field 1324. It is understood in the present invention that field 1314 could alternatively be used to store an odd sector while field 1318 could alternatively be used to store an even sector. Also, first row-portion 1310 could alternatively be used for storing the block address and flags.

Flag field 1324 is used for storing flag information which is used by controller 510 (FIG. 6) during access operations as further explained below. Block address field 1322 is used for storing the block address permanently assigned to block 1302, such as "0" for BLCK0. Only a single block address entry is required in the block address field per block. In a preferred embodiment, a block address entry is entered in block address field 1322 of the last row 1304, which is row 15.

In this alternative embodiment, the first and second split buses 680, 684 (FIG. 6) include lines coupled to receive data bytes of the even and odd sectors respectively. The controller 510 (FIG. 6) writes two sectors simultaneously by simultaneously writing a byte of an even sector and an odd sector simultaneously via the first and second split buses 680, 684 (FIG. 6), respectively. The split buses 680, 684 (FIG. 6) also provide for: transmission of ECC information between the flash memory chips and the flash state machine 642 and ECC logic unit 660 of the memory controller 510; and transmission of address information from flash state machine 642 to the flash memory chips.

FIG. 14 shows a timing diagram illustrating the timing of control signals, address signals, and data signals for an erase operation of the memory system of FIG. 6. The diagram includes: the wave form 902 representing the first flash signal which transmits time multiplexed command, address, and data information from the flash state machine 642 (FIG. 6) via first split bus 680 (FIG. 6) to the first flash memory chip; the wave form 904 representing the second flash signal which transmits time multiplexed command, address, and data signals transmitted from the flash state machine via second split bus 684 (FIG. 6) to the second flash memory chip; a time line 1450; and a plurality of control signal wave forms. The control signal wave forms, all of which are described above, include: wave form 906 representing the command line enable (CLE) signal; wave form 908 representing the address line enable (ALE) signal; wave form 910 representing the write enable (WE) signal; wave form 912 representing the read enable (RE) signal; wave form 914 representing the flash chip enable (FCE*) signal; and wave form 916 representing the flash ready/busy signal (FRDY_BSY* signal).

The erase operation commences at a time E0 at which the FCE* signal (wave form 914) transitions from a HIGH state to a LOW state thereby enabling the first and second flash memory chips to begin receiving command, address, and data signals. At a subsequent time E1, the CLE signal (wave form 906) is activated, transitioning from a LOW state to a HIGH state, thereby enabling the first and second flash memory chips to read command signals. At a time E2, the first and second flash signals (wave forms 902 and 904) each transmit a command signal. The first flash signal (wave form 902) transmits an 'erase set' command, 60H, via the first split bus 680 (FIG. 6) to the first flash memory chip while the second flash signal (wave form 904) transmits a read status command signal 70H via the second split bus 684 (FIG. 6) to the second flash memory chip. At a time E3, while the command signals 60H and 70H are active, the WE signal (wave form 910) transitions from a HIGH state to a LOW state thereby enabling the first and second flash memory chips to read the command signals 60H and 70H. At a time E4, the CLE signal (wave form 906) is deactivated, transitioning back to the LOW state, thereby disabling the flash memory chips from reading command signals.

Also at time E4, the ALE signal (wave form 908) is activated, transitioning from a LOW state to a HIGH state, thereby enabling the first and second flash memory chips to read packets of address information. At times E5 and E6, the first flash signal (wave form 902) transmits first and second address packets ADD0 and ADD1 respectively to the first flash memory chip wherein the first and second address packets ADD0 and ADD1 specify a sub-block 730 (FIG. 7) of the first flash memory chip 670 of the memory bank. At a time E7, the ALE signal (wave form 908) is deactivated. During time intervals between times E3 and E4, and E4 and E5, the WE signal (wave form 910) transitions to the LOW state to enable the flash memory chip to read the address packets.

At a time E8, the CLE signal (wave form 906) is again activated to enable the first and second memory chips to read command signals. At a time E9, the first flash signal (wave form 902) transmits DOH, which is an 'erase confirm command' to the first flash memory chip. This command, as sampled by the CLE signal, actually initiates the erase operation within the flash chips, after which, the contents of data fields 734 and 738 of each memory row portion 732 of the addressed sub-block 730 (FIG. 7) of the first flash memory chip 670 are erased, i.e. set to an "all 1's" state. At a time E10, the FRDY-BSY* signal (wave form 912) transitions from a HIGH state to a LOW state to indicate to the flash state machine 642 (FIG. 6) that at least one of the flash memory chips is busy.

At a time E11, the CLE signal (wave form 906) is activated to enable the first and second flash memory chips to read command signals. At a time E12, the first and second flash signals (wave forms 902 and 904) each transmit a command signal. The first flash signal (wave form 902) transmits a read command signal 70H via the first split bus 680 (FIG. 6) to the first flash memory chip while the second flash signal (wave form 904) transmits an erase command signal 60H via the second split bus 684 (FIG. 6) to the second flash memory chip. At a time E13, while the command signals 70H and 60H are active, the WE signal (wave form 910) transitions to the LOW state to enable the first and second flash memory chips to read the command signals 60H and 70H. At a time E14, the CLE signal (wave form 906) is deactivated to disable the flash memory chips from reading command signals and the ALE signal (wave form 908) is activated thereby enabling the first and second flash memory chips to read packets of address information. At times E15 and E16, the second flash signal (wave form 904) transmits first and second address packets ADD0 and ADD1 respectively to the second flash memory chip wherein the first and second address packets ADD0 and ADD1 specify a sub-block 731 (FIG. 7) of the second flash memory chip 672 of the memory bank. At a time E17, the ALE signal (wave form 908) is deactivated. During time intervals between times E13 and E14, and E14 and E15, the WE signal (wave form 910) enables the flash memory chips to read the address packets. At a time E18, the CLE signal (wave form 906) is again activated to enable the first and second memory chips to read command signals. At a time E19, the first flash signal (wave form 902) transmits DOH to the first flash memory chip to erase the contents of data fields 734 and 738 of each memory row portion 732 of the specified block and thereby set them to an "all 1's" state.

To summarize, during a time interval TEB1, between the times E0 and E11, the memory controller erases an addressed sub-block 730 (FIG. 7) of the first flash memory chip 670. Also, during a time interval TEB2, between the times E11 and E20, the memory controller erases a corresponding addressed sub-block 731 (FIG. 7) of the second flash memory chip 672. At a time E21, the FRDY_BSY* signal (wave form 916) transitions from a LOW state to a HIGH state to indicate to the flash state machine 642 (FIG. 6) that both of the flash memory chips are finished with the erase operation.

Immediately after time E21, the first and second flash signals (wave forms 902 and 904) each transmit a read status command signal 70H to the first and second flash memory chips respectively. While the read command signals 70H are active, the WE signal (wave form 910) transitions to the LOW state thereby enabling the first and second flash memory chips to read the read command signals 70H. At a time E22, the first and second flash signals (wave forms 902 and 904) both transmit a status data back to the controller.

So, the status of both flash memory chips are read simultaneously after the erase operation is performed on the two corresponding addressed sub-blocks of the flash memory chips as described above.

If either of the -sub-blocks 730, 731 of the memory chips has an error, the entire block 727 (FIG. 7) within the chips is marked defective by setting the contents of the defect flag 756 (FIG. 7) in the second flash memory chip 672.

FIG. 15 is a flowchart illustrating a process of erasing a block, including a first sub-block stored in a first memory unit and a second sub-block stored in a second memory unit, in accordance with the present invention. Microprocessor 620 (FIG. 6) executes instructions, which are stored in code RAM 626 (FIG. 6) to carry out the depicted process.

In step 1502, microprocessor 620 (FIG. 6) loads a block address to be erased. In step 1504, the microprocessor initiates the erase operations described above in reference to the timing diagram at 1400 (FIG. 14). At 1506, the microprocessor determines whether the erase operation is finished by reading the flash ready/busy (FRDY_BSY*) signal (wave form 916 of FIG. 14) which transitions from a LOW state to a HIGH state to indicate to the flash state machine 642 (FIG. 6) that both of the flash memory chips are finished with the erase operation. At 1508, the microprocessor reads the status of the flash chips 670, 672 (FIG. 6). At 1508, the microprocessor determines whether the erase operation performed in step 1504 was successful in both of the flash chips 670, 672 (FIG. 6) and, if so, the process ends. If it is determined that the erase operation performed in step 1504 was not successful in both of the flash chips, then the microprocessor marks the block in both of the flash chips 670, 672 defective.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A non-volatile memory system comprising:
   memory control circuitry; and
   a non-volatile memory unit coupled to the memory control circuitry and including one or more non-volatile memory devices organized into sectors, a sector including storage locations for a plurality of sectors of information, a sector of information being an even sector of information or an odd sector of information, even and odd sectors of information each including user data and overhead, the memory control circuitry for programming of user data of at least one even sector of information into a sector of a first non-volatile memory device and for programming of overhead of the at least one even sector of information into a sector of a second non-volatile memory device and for programming user data of at least one odd sector of information into the sector of the second non-volatile memory device and for programming the overhead of the at least one odd sector of information into the sector of the second non-volatile memory device,
   wherein sectors of information are programmed into at least two non-volatile memory devices simultaneously.

2. A non-volatile memory system, as recited in claim 1, wherein said non-volatile memory unit includes one or more flash memory chips.

3. A non-volatile memory system comprising:
   memory control circuitry; and
   a non-volatile memory unit coupled to the memory control circuitry and including one or more non-volatile memory devices organized into sectors, a sector including storage locations for a plurality of sectors of information, a sector of information being an even sector of information or an odd sector of information, even and odd sectors of information each including user data and overhead, the memory control circuitry for programming of user data of at least one first even sector of information into a sector of a first non-volatile memory device, for programming of user data of at least one second even sector of information into a sector of a second non-volatile memory device, and for programming of overhead of the at the least one first even sector of information and of the at least one second even sector of information into the sector of the second non-volatile memory device and for programming user data of at least one first odd sector of information into the sector of the second non-volatile memory device, for programming of user data of at least one second odd sector of information into the sector of the first non-volatile memory device, and for programming of overhead of the at least one first odd sector of information and of the at least one second odd sector of information into the sector of the second non-volatile memory device,
   wherein the user data of the at least one first even sector of information and the user data of the at least one second even sector of information are programmed into the first and second non-volatile memory devices simultaneously and the user data of the at least one first odd sector of information and the user data of the at least one second odd sector of information are programmed into the first and second non-volatile memory devices simultaneously.

4. A non-volatile memory system, as recited in claim 3, wherein said non-volatile memory unit includes one or more flash memory chips.

5. A non-volatile memory system comprising:
   memory control circuitry; and
   a non-volatile memory unit coupled to the memory control circuitry and including one or more non-volatile memory devices including storage locations for a plurality of sectors of information, a sector of information being an even sector of information or an odd sector of information, even and odd sectors of information each including user data and overhead, the memory control circuitry for programming of user data of at least one even sector of information into a first non-volatile memory device and for programming of overhead of the at least one even sector of information into a second non-volatile memory device and for programming user data of at least one odd sector of information into the second non-volatile memory device and for programming the overhead of the at least one odd sector of information into the second non-volatile memory device,
   wherein sectors of information are programmed into at least two non-volatile memory devices simultaneously.

6. A non-volatile memory system, as recited in claim 5, wherein said non-volatile memory unit is organized into sectors, a sector including storage locations for a plurality of sectors of information.

7. A non-volatile memory system, as recited in claim 5, wherein said non-volatile memory unit includes one or more flash memory chips.

8. A non-volatile memory system comprising:
   memory control circuitry; and
   a non-volatile memory unit coupled to the memory control circuitry and including one or more non-volatile memory devices including storage locations for a plurality of sectors of information, a sector of information being an even sector of information or an odd sector of information, even and odd sectors of information each including user data and overhead, the memory control circuitry for programming of user data of at least one first even sector of information and at least one first odd sector of information into a first non-volatile memory device and for programming user data of at least one second even sector of information and at least one second odd sector of information into a second non-volatile memory device and for programming of overhead of the at least one first even sector of information, the at least one second even sector of information, the at least one first odd sector of information, and the at least one second odd sector of information into the second non-volatile memory device, wherein the user data of the at least one first even sector of information and the user data of the at least one second even sector of information are programmed into the first and second non-volatile memory devices simultaneously and the user data of the at least one first odd sector of information and the user data of the at least one second odd sector of information are programmed into the first and second non-volatile memory devices simultaneously.

9. A non-volatile memory system, as recited in claim 8, wherein said non-volatile memory unit is organized into sectors, a sector including storage locations for a plurality of sectors of information.

10. A non-volatile memory system, as recited in claim 8, wherein said non-volatile memory unit includes one or more flash memory chips.

11. A non-volatile memory system comprising:
memory control circuitry; and
a non-volatile memory unit coupled to the memory control circuitry and organized into sectors, a sector including storage locations for a plurality of sectors of information, a sector of information being an even sector of information or an odd sector of information, even and odd sectors of information each including user data and overhead, the memory control circuitry for programming of user data of at least one even sector of information into a first sector and for programming of overhead of the at least one even sector of information into a second sector and for programming user data of the at least one odd sector of information into the second sector and for programming the overhead of the at least one odd sector of information into the second sector, wherein at least two sectors of information are programmed simultaneously.

12. A non-volatile memory system, as recited in claim 11, wherein said non-volatile memory unit includes one or more flash memory chips.

13. A non-volatile memory system comprising:
memory control circuitry; and
a non-volatile memory unit coupled to the memory control circuitry and organized into sectors, a sector including storage locations for a plurality of sectors of information, a sector of information being an even sector of information or an odd sector of information, even and odd sectors of information each including user, data and overhead, the memory control circuitry for programming of user data of at least one first even sector of information and of at least one first odd sector of information into a first sector and for programming user data of at least one second even sector of information and of at least one second odd sector of information into a second sector and for programming of overhead of the at least one first even sector of information, the at least one second even sector of information, the at least one first odd sector of information and the at least one second odd sector of information into the second sector, wherein the user data of the at the least one first even sector of information and the user data of the at least one second even sector of information are programmed simultaneously and the user data of the at the least one first odd sector of information and the user data of the at least one second odd sector of information are programmed simultaneously.

14. A non-volatile memory system, as recited in claim 13, wherein said non-volatile memory unit includes one or more flash memory chips.

15. A method for programming a plurality of sectors of information into at least two non-volatile memory devices organized into sectors of a non-volatile memory unit, a sector of information being an even sector of information or an odd sector of information and even and odd sectors of information each including user data and overhead, each sector including storage locations for a plurality of sectors of information, the method comprising:
programming the user data of at least one even sector of information into a sector of a first non-volatile memory device;
programming the user data of at least one odd sector of information into a sector of a second non-volatile memory device;
programming overhead of the at least one even sector of information into the sector of the second non-volatile memory device; and
programming overhead of the at least one odd sector of information into the sector of the second non-volatile memory device,
wherein sectors of information are programmed into the at least two non-volatile memory devices simultaneously.

16. A method for programming, as recited in claim 15, wherein said non-volatile memory unit including one or more flash memory chips.

17. A method for programming a plurality of sectors of information into at least two nonvolatile memory devices organized into sectors of a non-volatile memory unit, a sector of information being an even sector of information or an odd sector of information and even and odd sectors of information each including user data and overhead, each sector including storage locations for a plurality of sectors of information, the method comprising:
programming the user data of at least one first even sector of information into a sector of a first non-volatile memory device;
programming the user data of at least one second even sector of information into a sector of a second non-volatile memory device;
programming the user data of at least one first odd sector of information into the sector of the second non-volatile memory device;
programming the user data of at least one second odd sector of information into the sector of the first non-volatile memory device;
programming overhead of the at least one first even sector of information and of the at least one second even sector of information into the sector of the second non-volatile memory device; and
programming overhead of the at least one first odd sector of information and of the at least one second odd sector of information into the sector of the second non-volatile memory device,
wherein the user data of the at least one first even sector of information and the user data of the at least one second even sector of information are programmed into the first and second non-volatile memory devices simultaneously and the user data of the at least one first odd sector of information and the user data of the at least one second odd sector of information are programmed into the first and second non-volatile memory devices simultaneously.

18. A method for programming, as recited in claim 17, wherein said non-volatile memory unit including one or more flash memory chips.

19. A method for programming a plurality of sectors of information into at least two non-volatile memory devices, a sector of information being an even sector of information or an odd sector of information and even and odd sectors of information each including user data and overhead, the method comprising:
   programming of user data of at least one even sector of information into a first non-volatile memory device;
   programming of overhead of the at least one even sector of information into a second non-volatile memory device;
   programming user data of at least one odd sector of information into the second non-volatile memory device; and
   programming the overhead of the at least one odd sector of information into the second non-volatile memory device,
   wherein at least two sectors of information are programmed into at least two non-volatile memory devices simultaneously.

20. A method for programming, as recited in claim 19, wherein said non-volatile memory unit including one or more flash memory chips.

21. A method for programming, as recited in claim 19, wherein said non-volatile memory unit being organized into sectors, a sector including storage locations for a plurality of sectors of information.

22. A method for programming a plurality of sectors of information into at least two non-volatile memory devices, a sector of information being an even sector of information or an odd sector of information and even and odd sectors of information each including user data and overhead, the method comprising:
   programming of user data of at least one first even sector of information and at least one first odd sector of information into a first non-volatile memory device;
   programming user data of at least one second even sector of information and at least one second odd sector of information into the second non-volatile memory device; and
   programming of overhead of the at least one first even sector of information, the at least one second even sector of information, the at least one first odd sector of information, and the at least one second odd sector of information into the second non-volatile memory device;
   wherein the user data of the at least one first even sector of information and the user data of the at least one second even sector of information are programmed into the first and second non-volatile memory devices simultaneously and the user data of the at least one first odd sector of information and the user data of the at least one second odd sector of information are programmed into the first and second non-volatile memory devices simultaneously.

23. A method for programming, as recited in claim 22, wherein said non-volatile memory unit including one or more flash memory chips.

24. A method for programming, as recited in claim 22, wherein said non-volatile memory unit being organized into sectors, a sector including storage locations for a plurality of sectors of information.

25. A method for programming a plurality of sectors of information in a non-volatile memory unit organized into sectors, a sector including storage locations for a plurality of sectors of information, a sector of information being an even sector of information or an odd sector of information, even and odd sectors of information each including user data and overhead, the method comprising:
   programming of user data of at least one even sector of information into a first sector;
   programming of overhead of the at least one even sector of information into a second sector;
   programming user data of the at least one odd sector of information into the second sector; and
   programming the overhead of the at least one odd sector of information into the second sector,
   wherein at least two sectors of information are programmed simultaneously.

26. A method for programming, as recited in claim 25, wherein said non-volatile memory unit including one or more flash memory chips.

27. A method for programming a plurality of sectors of information in a non-volatile memory unit organized into sectors, a sector including storage locations for a plurality of sectors of information, a sector of information being an even sector of information or an odd sector of information, even and odd sectors of information each including user data and overhead, the method comprising:
   programming of user data of at least one first even sector of information and of at least one first odd sector of information into a first sector;
   programming user data of at least one second even sector of information and of at least one second odd sector of information into a second sector; and
   programming of overhead of the at the least one first even sector of information, the at least one second even sector of information, the at least one first odd sector of information, and the at least one second odd sector of information into the second sector;
   wherein the user data of the at the least one first even sector of information and the user data of the at least one second even sector of information are programmed simultaneously and the user data of the at the least one first odd sector of information and the user data of the at least one second odd sector of information are programmed simultaneously.

28. A method for writing programming, as recited in claim 27, wherein said non-volatile memory unit including one or more flash memory chips.

29. A non-volatile memory system comprising:
   memory control circuitry; and
   a non-volatile memory unit coupled to the memory control circuitry including a plurality of rows, each row including one or more row-portions, each row-portion including storage locations providing storage space for a plurality of sectors of information, a sector of information being an even sector of information or an odd sector of information, even and odd sectors of information each including user data and overhead, the memory control circuitry for programming of user data of at least one even sector of information into a first row-portion and for programming of overhead of the at least one even sector of information into a second row-portion and for programming user data of at least one odd sector of information into the second row-portion and for programming the overhead of the at least one odd sector of information into the second row-portion, wherein at least two sectors of information are programmed to a row simultaneously.

30. A non-volatile memory system, as recited in claim 29, wherein said non-volatile memory unit includes one or more flash memory chips.

31. A non-volatile memory system, as recited in claim 29, wherein said non-volatile memory unit being organized into sectors, a sector including storage locations for a plurality of sectors of information.

32. A non-volatile memory system comprising:
    memory control circuitry; and
    a non-volatile memory unit coupled to the memory control circuitry including a plurality of rows, each row including one or more row-portions, each row-portion including storage locations for a plurality of sectors of information, a sector of information being an even sector of information or an odd sector of information, even and odd sectors of information each including user data and overhead, the memory control circuitry for programming of user data of at least one first even sector of information into a first row-portion, for programming of user data of at least one first odd sector of information into the first row-portion, for programming user data of at least one second even sector of information into a second row-portion, for programming of user data of at least one second odd sector of information into the second row-portion, and for programming of overhead of the at least one first even sector of information, the at least one second even sector of information, the at least one first odd sector of information, and, the at least one second odd sector of information into the second row-portion,
    wherein the user data of the at least one first even sector of information and the user data of the at least one second even sector of information are programmed into the first and second row portions simultaneously, and the user data of the at least one first odd sector of information and the user data of the at least one second odd sector of information are programmed into the first and second row portions simultaneously.

33. A non-volatile memory system, as recited in claim 32, wherein said non-volatile memory unit includes one or more flash memory chips.

34. A non-volatile memory system, as recited in claim 32, wherein said non-volatile memory unit being organized into sectors, a sector including storage locations for a plurality of sectors of information.

35. A method for programming a plurality of sectors of information into a non-volatile memory unit including a plurality of rows, each row including one or more row-portions, each row-portion including storage locations providing storage space for a plurality of sectors of information, a sector of information being an even sector of information or an odd sector of information, even and odd sectors of information each including user data and overhead, the method comprising:

programming of user data of at least one even sector of information into a first row-portion;
programming of overhead of the at least one even sector of information into a second row-portion;
programming user data of at least one odd sector of information into the second row-portion; and
programming the overhead of the at least one odd sector of information into the second row-portion,
wherein at least two sectors of information are programmed to a row simultaneously.

36. A method for programming, as recited in claim 35, wherein said non-volatile memory unit including one or more flash memory chips.

37. A method for programming, as recited in claim 35, wherein said non-volatile memory unit being organized into sectors, a sector including storage locations for a plurality of sectors of information.

38. A method for programming a plurality of sectors of information into a non-volatile memory unit including a plurality of rows, each row including one or more row-portions, each row-portion including storage locations providing storage space for a plurality of sectors of information, a sector of information being an even sector of information or an odd sector of information, even and odd sectors of information each including user data and overhead, the method comprising:

programming of user data of at least one first even sector of information and of at least one first odd sector of information into a first row-portion;
programming user data of at least one second even sector of information and of at least one second odd sector of information into a second row-portion; and
programming of overhead of the at least one first even sector of information, the at least one second even sector of information, the at least one first odd sector of information, and the at least one second odd sector of information into the second row-portion;
wherein the user data of the at least one first even sector of information and the user data of the at least one second even sector of information are programmed into the first and second row portions simultaneously, and the user data of the at least one first odd sector of information and the user data of the at least one second odd sector of information are programmed into the first and second row portions simultaneously.

39. A method for programming, as recited in claim 38, wherein said non-volatile memory unit including one or more flash memory chips.

40. A method for programming, as recited in claim 38, wherein said non-volatile memory unit being organized into sectors, a sector including storage locations for a plurality of sectors of information.

* * * * *